(12) United States Patent
Chang

(10) Patent No.: US 11,810,907 B2
(45) Date of Patent: Nov. 7, 2023

(54) PIXEL STRUCTURE FOR DISPLAYS

(71) Applicant: Taiwan Semiconductor Manufacturing Co., Ltd., Hsinchu (TW)

(72) Inventor: Yu-Hsing Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 201 days.

(21) Appl. No.: 17/243,972

(22) Filed: Apr. 29, 2021

(65) Prior Publication Data

US 2022/0238500 A1 Jul. 28, 2022

Related U.S. Application Data

(60) Provisional application No. 63/142,022, filed on Jan. 27, 2021.

(51) Int. Cl.
*H10K 59/123* (2023.01)
*H01L 25/16* (2023.01)
(Continued)

(52) U.S. Cl.
CPC ...... *H01L 25/167* (2013.01); *H01L 21/76802* (2013.01); *H01L 21/76885* (2013.01); *H01L 27/1248* (2013.01); *H01L 27/156* (2013.01); *H01L 33/405* (2013.01); *H01L 33/60* (2013.01); *H01L 33/62* (2013.01); *H10K 50/818* (2023.02); *H10K 50/856* (2023.02);
(Continued)

(58) Field of Classification Search
CPC ....... H01L 27/1214–1296; H01L 27/32–3293; H01L 25/0753; H01L 51/5271; H10K 59/123
See application file for complete search history.

(56) References Cited

U.S. PATENT DOCUMENTS

2003/0156239 A1* 8/2003 Inoue .................. H01L 27/3244
349/113
2003/0156240 A1* 8/2003 Oda .................. G02F 1/136227
349/113

(Continued)

FOREIGN PATENT DOCUMENTS

KR 20140079684 A 6/2014
TW 202042387 A 11/2020

OTHER PUBLICATIONS

Chen et al. "Endurance/Retention Trade-off on HfO2/Metal Cap 1T1R Bipolar RRAM." IEEE Transactions on Electron Devices, vol. 60, No. 3, Published Mar. 2013.

(Continued)

*Primary Examiner* — Bryan R Junge
(74) *Attorney, Agent, or Firm* — Eschweiler & Potashnik, LLC

(57) ABSTRACT

Various embodiments of the present disclosure are directed towards an integrated circuit (IC) chip comprising a display pixel in which a bottom electrode and a reflector are separate and border. A light emission device overlies the reflector, and a top electrode overlies the light emission device. A coupling structure extends from the bottom electrode, alongside the reflector, to an interface between the light emission device and the reflector to electrically couple the bottom electrode to the light emission device.

20 Claims, 16 Drawing Sheets

(51) Int. Cl.

| | |
|---|---|
| H01L 27/15 | (2006.01) |
| H01L 33/62 | (2010.01) |
| H01L 33/60 | (2010.01) |
| H01L 21/768 | (2006.01) |
| H01L 27/12 | (2006.01) |
| H01L 33/40 | (2010.01) |
| H10K 50/818 | (2023.01) |
| H10K 50/856 | (2023.01) |
| H10K 59/124 | (2023.01) |
| H10K 71/00 | (2023.01) |
| H10K 59/12 | (2023.01) |
| H10K 102/00 | (2023.01) |

(52) U.S. Cl.
CPC ......... H10K 59/123 (2023.02); H10K 59/124 (2023.02); H10K 71/00 (2023.02); *H10K 59/1201* (2023.02); *H10K 2102/3026* (2023.02)

(56) References Cited

U.S. PATENT DOCUMENTS

| | | | | |
|---|---|---|---|---|
| 2007/0295961 | A1* | 12/2007 | Kim | H10K 50/856 |
| | | | | 257/40 |
| 2008/0018243 | A1* | 1/2008 | Ishiguro | H10K 50/856 |
| | | | | 313/506 |
| 2008/0169757 | A1* | 7/2008 | Chang | H10K 50/856 |
| | | | | 313/504 |
| 2008/0309233 | A1* | 12/2008 | Hasegawa | H01L 27/3248 |
| | | | | 313/505 |
| 2009/0195151 | A1 | 8/2009 | Nagayama et al. | |
| 2013/0134450 | A1 | 5/2013 | Chang et al. | |
| 2015/0021627 | A1* | 1/2015 | Fujita | H01L 31/18 |
| | | | | 257/82 |
| 2016/0293878 | A1* | 10/2016 | Maruyama | H10K 50/856 |
| 2017/0148861 | A1 | 5/2017 | Kim | |
| 2018/0102498 | A1* | 4/2018 | Shin | H01L 51/5209 |
| 2018/0151548 | A1 | 5/2018 | Pfeuffer et al. | |
| 2019/0384075 | A1 | 12/2019 | Bhaskaran et al. | |
| 2021/0020868 | A1* | 1/2021 | Ikeda | H01L 51/5265 |
| 2021/0104505 | A1 | 4/2021 | Ikeda et al. | |
| 2021/0111235 | A1* | 4/2021 | Ichikawa | H05B 33/22 |
| 2021/0210513 | A1 | 7/2021 | Ikeda et al. | |
| 2022/0013578 | A1 | 1/2022 | Ikeda et al. | |

OTHER PUBLICATIONS

Jahnel et al. "Narrow Bandwidth Top-Emitting OLEDs Designed for Rhodamine 6G Excitation in Biological Sensing Applications." Electronics 2015, 4, 982-994; doi:10.3390/electronics40409, published on Nov. 25, 2015.

* cited by examiner

PIXEL STRUCTURE FOR DISPLAYS

REFERENCE TO RELATED APPLICATION

This Application claims the benefit of U.S. Provisional Application No. 63/142,022, filed on Jan. 27, 2021, the contents of which are hereby incorporated by reference in their entirety.

BACKGROUND

Micro displays are small displays often having screen sizes of less than one or two inches diagonal. Among other things, micro displays are employed for mobile applications, head-mounted displays, projectors, and digital cameras. A micro display comprises a plurality of pixels coordinating to generate an image by transmission, reflection, or emission of light. Increasingly, emissive-type micro displays are being employed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
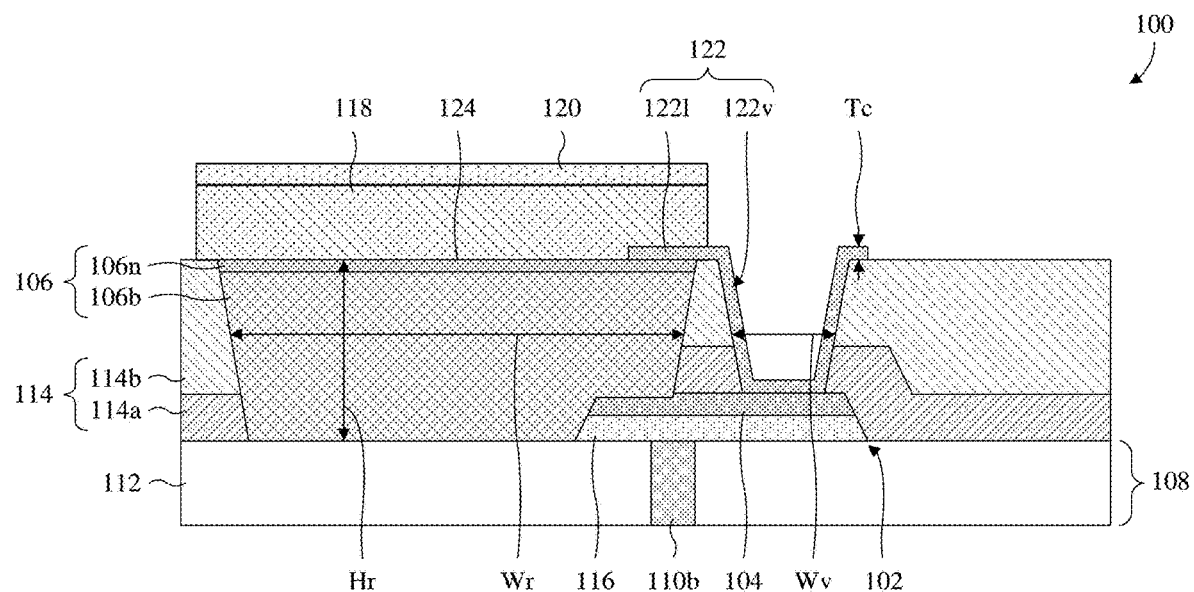
FIG. 1 provides a cross-sectional view of some embodiments of an integrated circuit (IC) chip comprising a display pixel in which a bottom electrode and a reflector are separate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) chip may comprise a micro display structure integrated with a display driver on a common semiconductor substrate. The micro display structure overlies the display driver on a front side of the common semiconductor substrate and comprises a plurality of pixels. A pixel may comprise a bottom electrode/reflector, a light emission device overlying the bottom electrode/reflector, and a top electrode overlying the light emission device.

A challenge with the IC chip is the bottom electrode/reflector is commonly a metal that has high reactivity with oxygen and that oxidizes to form native oxide that is dielectric. For example, the bottom electrode/reflector may be aluminum or some other suitable metal. Because of the high reactivity, the native oxide layer is likely to form along a top of the reflector during manufacture of the IC chip. Because the native oxide layer is dielectric, the native oxide layer electrically isolates the bottom electrode/reflector from the light emission device. This, in turn, creates an electrical open that degrades bulk manufacturing yields.

To alleviate the challenge, the bottom electrode/reflector may be metal that has a low reactivity with oxygen and/or that oxidizes to form native oxide that is conductive. However, such metals have low reflectance. Therefore, the micro display structure would have poor optical performance if such metals were used.

Various embodiments of the present disclosure are directed towards an IC chip comprising a display pixel in which a bottom electrode and a reflector are separate, as well as a method for forming the IC chip. A light emission device overlies the reflector, and a top electrode overlies the light emission device. A coupling structure extends from the bottom electrode, alongside the reflector, to a bottom surface of the light emission device to electrically couple the bottom surface to the bottom electrode.

Because the bottom electrode and the reflector are separate, and because the coupling structure extends from the bottom electrode to the bottom surface of the light emission device, electrical coupling from the bottom surface of the light emission device to a display driver or some other suitable circuit does not depend on the reflector. As such, materials respectively of the reflector, the bottom electrode, and the coupling structure may be chosen so as to both achieve good optical performance and prevent oxidation from causing an electrical open from the bottom electrode to the bottom surface of the light emission device.

Material of the reflector may be chosen so it has a high reflectivity even though it may also have a high reactivity with oxygen and even though it may oxidize to form native oxide that is dielectric. The high reflectivity may promote good optical performance. Materials respectively of the bottom electrode and the conductive structure may be chosen so the materials have low reactivity with oxygen and oxidize to form native oxide that is conductive even though the materials may have low reflectivity. The low reactivity and the conductive native oxide may prevent an electrical open from the bottom electrode to the bottom surface of the light emission device, whereby bulk manufacturing yields may be high.

With reference to FIG. 1, a cross-sectional view 100 of some embodiments of an IC chip comprising a display pixel 102 is provided in which a bottom electrode 104 and a reflector 106 are separate. The display pixel 102 overlies and electrically couples to an interconnect structure 108, which comprises a bottom electrode via 110b inset into an interconnect dielectric layer 112. The interconnect structure 108 may, for example, provide electrical coupling from the bottom electrode 104 to a display driver circuit or some other suitable circuit.

The bottom electrode 104 overlies the bottom electrode via 110b and underlies a pixel dielectric layer 114. Further, the bottom electrode 104 is separated from, and electrically coupled to, the bottom electrode via 110b by a bottom electrode barrier 116. In alternative embodiments, the bottom electrode barrier 116 may be omitted. The bottom electrode barrier 116 is conductive and blocks diffusion material from the bottom electrode via 110b to the bottom electrode 104. The bottom electrode barrier 116 may, for example, be or comprise titanium nitride (e.g., TiN), tantalum nitride (e.g., TaN), some other suitable material(s), or any combination of the foregoing.

The reflector 106 is inset into and extends through the pixel dielectric layer 114. Further, the reflector 106 borders the bottom electrode 104 and partially covers the bottom electrode 104. In alternative embodiments, the reflector 106 and the bottom electrode 104 are laterally spaced, such that the bottom electrode 104 is not covered by the reflector 106. The reflector 106 comprises a conductive body 106b and a native oxide layer 106n overlying the conductive body 106b. The conductive body 106b is or comprises a conductive material, and the native oxide layer 106n is or comprises native oxide of the conductive material. In some embodiments, the native oxide layer 106n may be discontinuous or omitted.

A light emission device 118 overlies the reflector 106, and a top electrode 120 overlies the light emission device 118. The top electrode 120 is transparent and may, for example, be or comprise gold (e.g., Au), silver (e.g., Ag), indium tin oxide (ITO), some other suitable conductive material(s), or any combination of the foregoing. The light emission device 118 may, for example, be a micro light-emitting diode (microLED), an organic light-emitting diode (OLED), a light-emitting diode (LED), or some other suitable device.

A coupling structure 122 overlies the bottom electrode 104 and the reflector 106. Further, the coupling structure 122 extends from a top surface of the bottom electrode 104, alongside the reflector 106, to a bottom surface of the light emission device 118 to provide electrical coupling from the bottom electrode 104 to the light emission device 118. The coupling structure 122 comprises a coupling layer 122l and a coupling via 122v.

The coupling via 122v is a portion of the coupling layer 122l that has a top indent and that extends through the pixel dielectric layer 114 from the bottom electrode 104. In alternative embodiments, the coupling via 122v is distinct from the coupling layer 122l. The coupling layer 122l extends from the coupling via 122v to an interface 124 between the light emission device 118 and the reflector 106 to provide electrical coupling from the coupling via 122v to the bottom surface of the light emission device 118.

Because the bottom electrode 104 and the reflector 106 are separate, and because the coupling structure 122 extends from the bottom electrode 104 to the bottom surface of the light emission device 118, electrical coupling from the bottom surface to the interconnect structure 108 is through the bottom electrode 104 and the coupling structure 122 rather than through the reflector 106. Accordingly, materials respectively of the reflector 106, the bottom electrode 104, and the coupling structure 122 may be chosen so as to both achieve good optical performance and prevent oxidation from causing an electrical open from the bottom electrode 104 to the bottom surface of the light emission device 118.

Material of the reflector 106 may be chosen so it has a high reflectivity even though it may also have a high reactivity with oxygen and even though it may oxidize to form native oxide that is dielectric. The high reflectivity may promote good optical performance. Materials respectively of the bottom electrode 104 and the coupling structure 122 may be chosen so the materials have low reactivity with oxygen and oxidize to form native oxide that is conductive even though the materials may have low reflectivity. The low reactivity and the conductive native oxide may prevent native oxide from causing an electrical open from the bottom electrode 104 to the bottom surface of the light emission device 118, whereby bulk manufacturing yields may be high. Also, note that metal that has a low reactivity with oxygen and/or that oxidizes to form native oxide that is conductive tends to have low reflectance.

With continued reference to FIG. 1, the pixel dielectric layer 114 comprises a first dielectric layer 114a and a second dielectric layer 114b overlying the first dielectric layer 114a. In alternative embodiments, the first or second dielectric layer 114a, 114b is omitted. The first and second dielectric layers 114a, 114b are different materials and may, for example, be or comprise silicon oxide (e.g., $SiO_2$), silicon nitride (e.g., SiN), some other suitable material(s), or any combination of the foregoing. In some embodiments, the first dielectric layer 114a is silicon nitride and the second dielectric layer 114b is silicon oxide or vice versa.

In some embodiments, the bottom electrode via 110b is or comprises copper, tungsten, some other suitable conductive material(s) and/or metal(s), or any combination of the foregoing. In some embodiments in which the bottom electrode via 110b is or comprises copper, the bottom electrode barrier 116 is or comprises tantalum nitride or some other suitable barrier material for copper. In some embodiments in which the bottom electrode via 110b is or comprises tungsten, the bottom electrode barrier 116 is or comprises titanium nitride or some other suitable barrier material for tungsten. In some embodiments, the interconnect dielectric layer 112 is or comprises silicon oxide (e.g., $SiO_2$) and/or some other suitable dielectric(s).

In some embodiments, the reflector 106 is more reactive with oxygen than the coupling structure 122 and/or the bottom electrode 104. For example, the reflector 106 may depend on less energy to react with oxygen than the coupling structure 122 and/or the bottom electrode 104. In some embodiments, the reflector 106 depends on less than about 3 electron volts (eV), 4 eV, or some other suitable amount of energy to react with oxygen. In some embodiments, the reflector 106 is more reflective of radiation emitted by the light emission device 118 than the coupling structure 122 and/or the bottom electrode 104. For example, the reflector 106 may reflect a greater percentage of the radiation than the coupling structure 122 and/or the bottom electrode 104. In some embodiments, the conductive body 106b is or comprises aluminum and/or some other suitable metal(s). In some embodiments, the conductive body 106b is or comprises aluminum, and the native oxide layer 106n is or comprises aluminum oxide. In alternative embodiments, the reflector 106 is dielectric, whereby the conductive body 106b and the native oxide layer 106n are replaced with a dielectric layer.

In some embodiments, a width Wr of the reflector 106 is or comprises about 100 nanometers to about 50 micrometers, about 100 nanometers to about 25 micrometers, about 25-50 micrometers, or some other suitable value. In some embodiments, a height Hr of the reflector is about 1-20 kilo angstroms, about 1-10 kilo angstroms, about 10-20 kilo angstroms, or some other suitable value.

In some embodiments, the bottom electrode 104 and the coupling structure 122 are the same material. In other embodiments, the bottom electrode 104 and the coupling structure 122 are different materials. The bottom electrode 104 and/or the coupling structure 122 may, for example, be or comprise tantalum nitride (e.g., TaN), titanium nitride (e.g., TiN), ITO, platinum (e.g., Pt), gold (e.g., Au), some other suitable metal(s) and/or conductive material(s), or any combination of the foregoing. Further, the bottom electrode 104 and/or the coupling structure 122 may, for example, be or comprise a noble metal and/or an inert metal. In some embodiments, the bottom electrode 104 and/or the coupling structure 122 has/have low reactivities with oxygen. For example, the bottom electrode 104 and/or the coupling structure 122 may depend on more than about 5 eV, 6 eV, or some other suitable amount of energy to react with oxygen. In some embodiments, native oxide of the bottom electrode 104 is conductive and/or native oxide of the coupling structure 122 is conductive. In some embodiments, native oxide of the bottom electrode 104 and/or native oxide of the coupling structure 122 has/have a lower resistivity than the native oxide layer 106n.

In some embodiments, a width Wv of the coupling via 122v is about 50-1000 nanometers, about 50-500 nanometers, about 500-1000 nanometers, or some other suitable value. If the width Wv is too small (e.g., less than about 50 nanometers), process control during formation of the coupling via 122v may be overly hard and manufacturing yields may be low. If the width Wv is too large (e.g., more than about 1000 nanometers), pixel density may be low. Further, topography at the display pixel 102 may have a high degree of variation that may pose processing challenges and degrade manufacturing yields.

In some embodiments, a thickness Tc of the coupling layer 122l is about 50-1000 angstroms, about 50-500 angstroms, about 500-1000 angstroms, or some other suitable value. If the thickness Tc is too small (e.g., less than about 50 angstroms), resistance from the bottom electrode 104 to the bottom surface of the light emission device 118 may be high and electrical performance may be poor. If the thickness Tc is too large (e.g., more than about 1000 angstroms), topography at the display pixel 102 may have a high degree of variation that may pose processing challenges and degrade manufacturing yields.

Figure 2A:
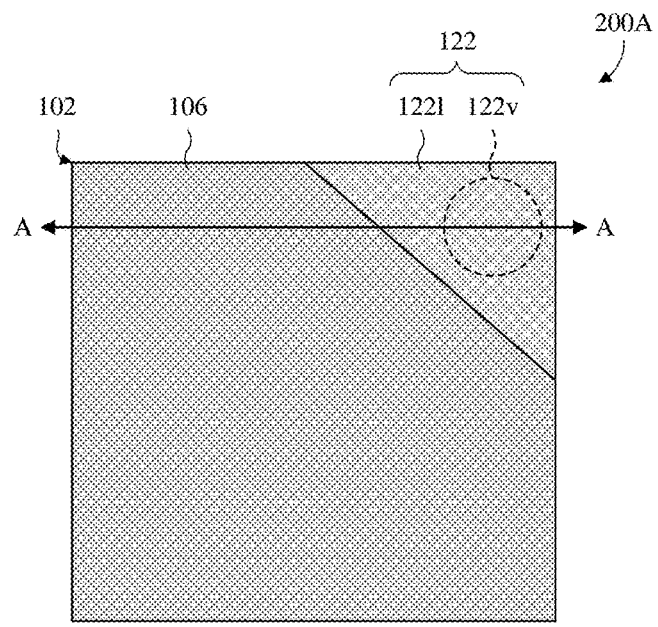
FIGS. 2A and 2B provide top views of some different embodiments of the reflector of FIG. 1 and a coupling structure of FIG. 1.
Figure 2B:
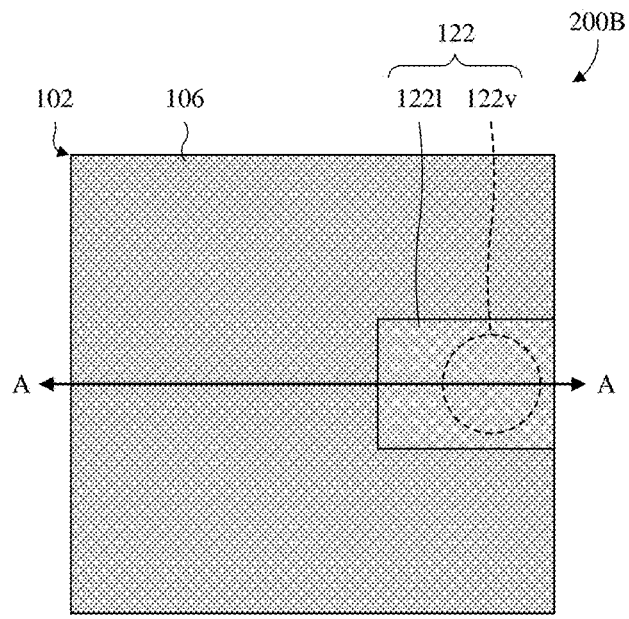

With reference to FIGS. 2A and 2B, top views 200A, 200B of some different embodiments of the reflector 106 of FIG. 1 and the coupling structure 122 of FIG. 1 are provided. The cross-sectional view 100 of FIG. 1 may, for example, be taken along line A-A in any of FIGS. 2A and 2B or along some other suitable line in any of FIGS. 2A and 2B.

In FIG. 2A, the reflector 106 and the coupling structure 122 collectively define a square or rectangular shape. Further, the coupling structure 122 is at a corner of the square or rectangular shape and itself has a triangular shape. In alternative embodiments, the coupling structure 122 is at any other corner of the square or rectangular shape.

In FIG. 2B, the reflector 106 and the coupling structure 122 are as in FIG. 2A, except that the coupling structure 122 is offset from corners of the square or rectangular shape. Further, the coupling structure 122 itself has a square or rectangular shape.

While FIGS. 2A and 2B illustrate the reflector 106 and the coupling structure 122 collectively defining a square or rectangular shape, the reflector 106 and the coupling structure 122 may define a circular shape, a triangular shape, or some other suitable shape in alternative embodiments. Further, individual shapes of the reflector 106 and the coupling structure 122 may also be different in alternative embodiments. For example, the coupling structure 122 of FIG. 2A may alternatively have a square or rectangular shape.

With reference to FIGS. 3A-3I, cross-sectional views 300A-300I of some different alternative embodiments of the IC chip of FIG. 1 are provided.

Figure 3A:
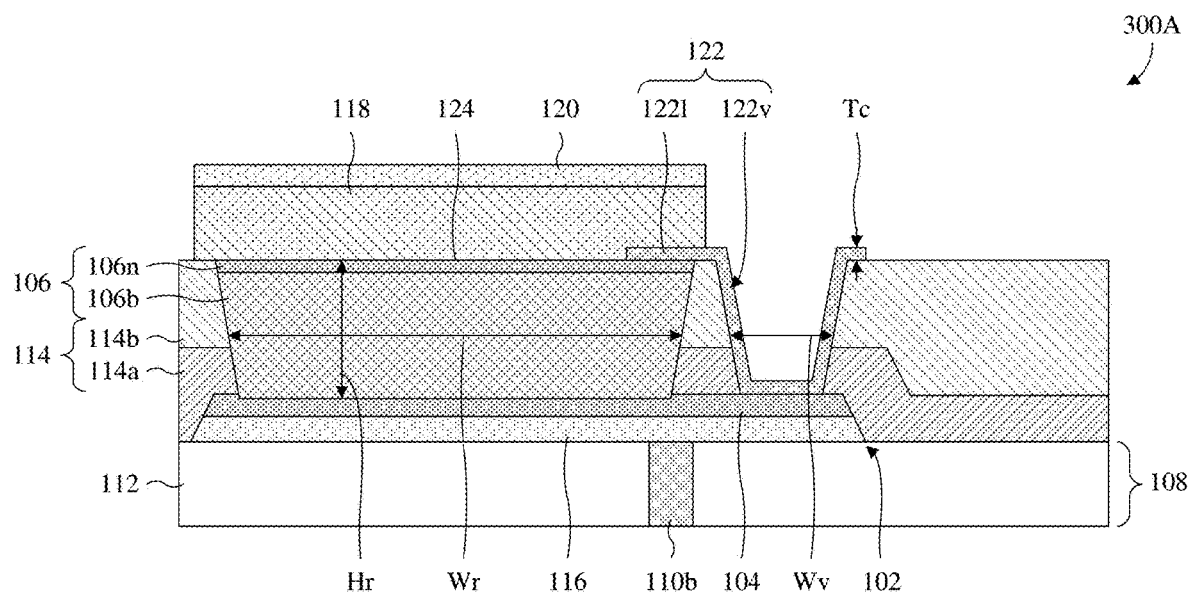
FIGS. 3A-3I provide cross-sectional views of some alternative embodiments of the IC chip of FIG. 1.

In FIG. 3A, the bottom electrode 104 and the bottom electrode barrier 116 extend along a bottom surface of the reflector 106, from a first sidewall of the reflector 106 to a second sidewall of the reflector 106 that is opposite the first sidewall. Further, the bottom electrode 104 and the bottom electrode barrier 116 have individual widths greater than the width Wr of the reflector 106. Accordingly, the bottom electrode 104 directly contacts an entire bottom surface of the reflector 106 within the cross-sectional view 300A of FIG. 3A. In some embodiments, the bottom electrode 104 further directly contacts an entire bottom surface of the reflector 106 outside the cross-sectional view 300A of FIG. 3A.

Figure 3B:
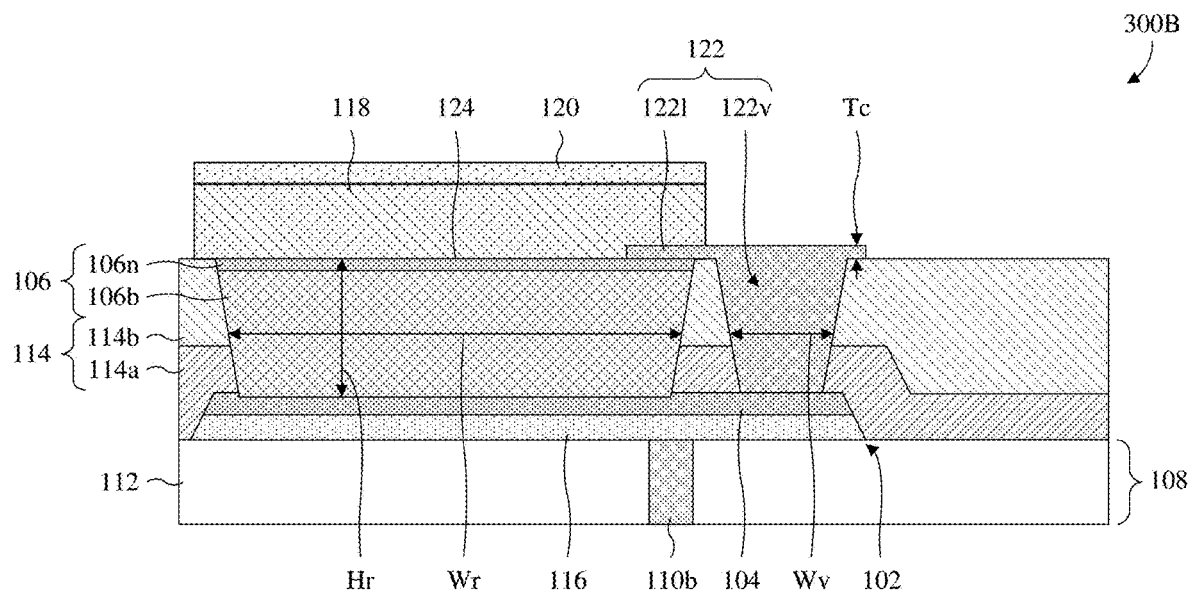

In FIG. 3B, the coupling via 122v is solid throughout (e.g., fully fills a via opening within which it is formed) instead of U- or V-shaped. Further, a top surface of the coupling layer 122l is flat and continuous from a first side of the coupling via 122v to a second side of the coupling via 122v opposite the first side at an elevation greater than that of the reflector 106. Because the coupling via 122v is solid throughout, resistance from the bottom electrode 104 to the bottom surface of the light emission device 118 is reduced and electrical performance of the display pixel 102 is improved.

Figure 3C:
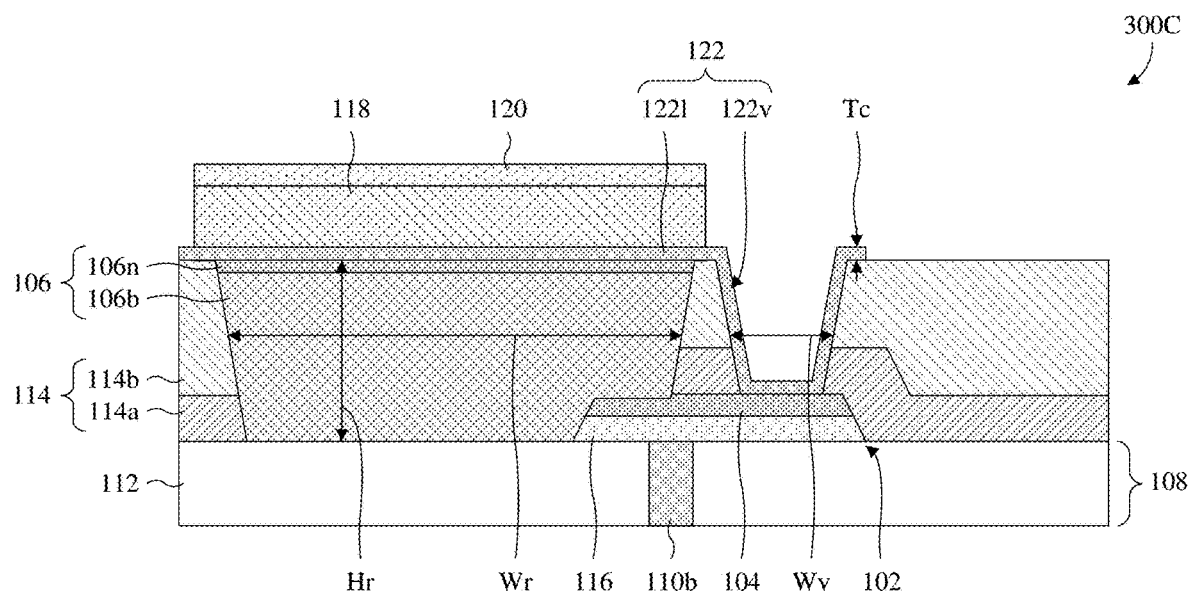

In FIG. 3C, the coupling layer 122l has a width greater than the width Wr of the reflector 106 and extends along a top surface of the reflector 106, from a first sidewall of the reflector 106 to a second sidewall of the reflector 106 that is opposite the first sidewall. Further, the coupling layer 122l has a width greater than that of the light emission device 118 and extends along a bottom surface of the light emission device 118, from a first sidewall of the light emission device 118 to a second sidewall of the light emission device 118 that is opposite the first sidewall. Accordingly, the coupling layer 122l directly contacts an entire top surface of the reflector 106, and directly contacts an entire bottom surface of the light emission device 118, within the cross-sectional view 300C of FIG. 3C. In some embodiments, the coupling layer 122l further directly contacts an entire top surface of the reflector 106 outside the cross-sectional view 300C of FIG. 3C and/or directly contacts an entire bottom surface of the light emission device 118 outside the cross-sectional view 300C of FIG. 3C.

Because the coupling layer 122l blankets the top surface of the reflector 106, a contact area at which the coupling layer 122l directly contacts the bottom surface of the light emission device 118 is greater than in FIG. 1. As such, the contact resistance between the bottom surface of the light emission device 118 and the coupling layer 122l is reduced. This may, in turn, improve electrical performance (e.g., power consumption) of the display pixel 102. Additionally, because the coupling layer 122l blankets the top surface of the reflector 106, the coupling layer 122l is transparent to radiation emitted by the light emission device 118. For example, the coupling layer 122l may be or comprise ITO, gold (e.g., Au), silver (e.g., Ag), some other suitable material, or any combination of the foregoing. The transparency prevents the coupling layer 122l from impacting or reduces the impact the coupling layer 122 has on optical performance of the display pixel 102.

Figure 3D:
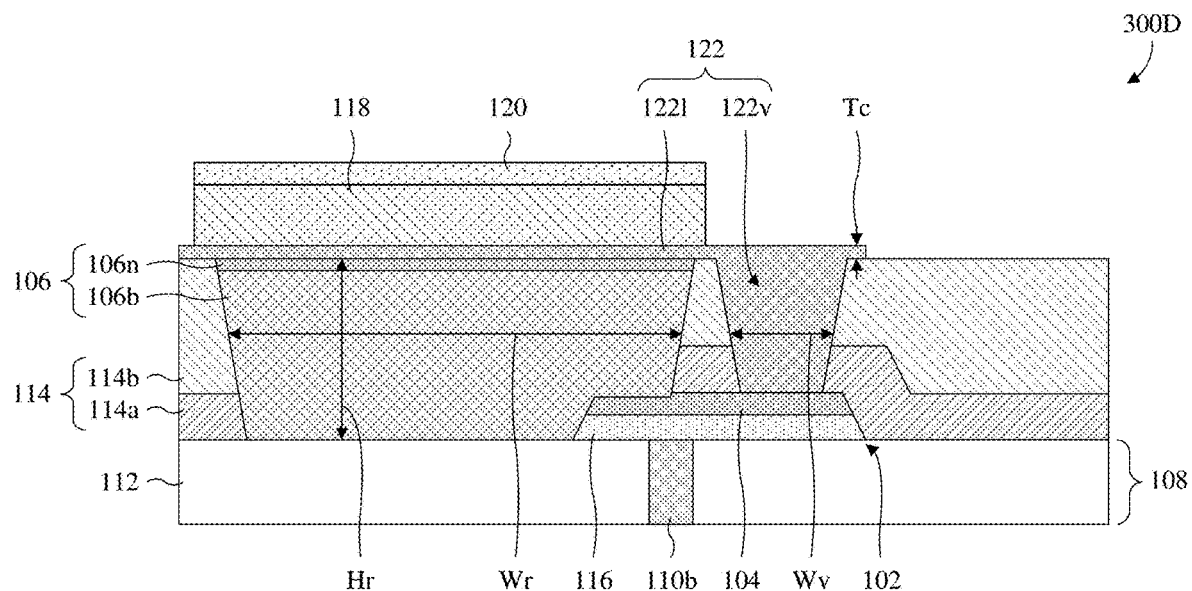

In FIG. 3D, the display pixel 102 is as in FIG. 3C, except that the coupling via 122v is solid throughout (e.g., fully fills a via opening within which is formed) as described with regard to FIG. 3B.

Figure 3E:
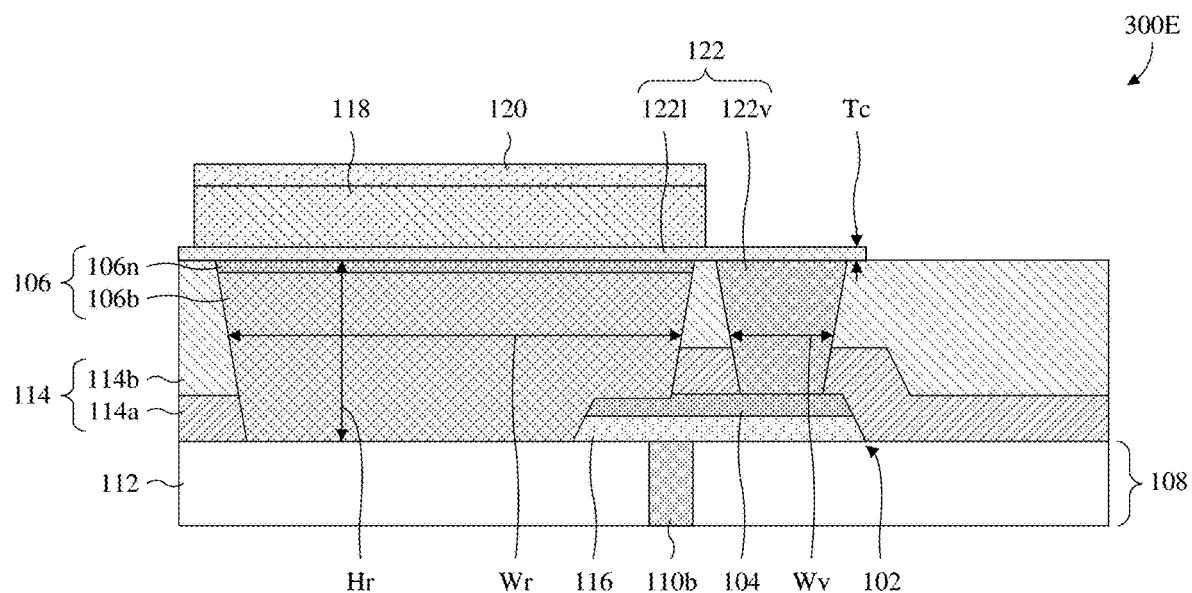

In FIG. 3E, the display pixel 102 is as in FIG. 3D, except that the coupling via 122v and the coupling layer 122l are distinct from each other. For example, the coupling via 122v and the coupling layer 122l may be different materials.

In some embodiments, the coupling via 122v is or comprises tantalum nitride, titanium nitride, some other suitable material(s), or any combination of the foregoing, and/or the coupling layer 122l is or comprises ITO, gold (e.g., Au), silver (e.g., Ag), some other suitable material(s), or any combination of the foregoing. In some embodiments, the coupling via 122v is opaque to radiation emitted by the light emission device 118, whereas the coupling layer 122l is transparent to the radiation. In some embodiments, the coupling layer 122l has a higher transmission for the radiation emitted by the light emission device 118 than the coupling via 122v. In some embodiments, the coupling via 122v and the coupling layer 122l have the same or similar transmission for the radiation emitted by the light emission device 118.

Figure 3F:
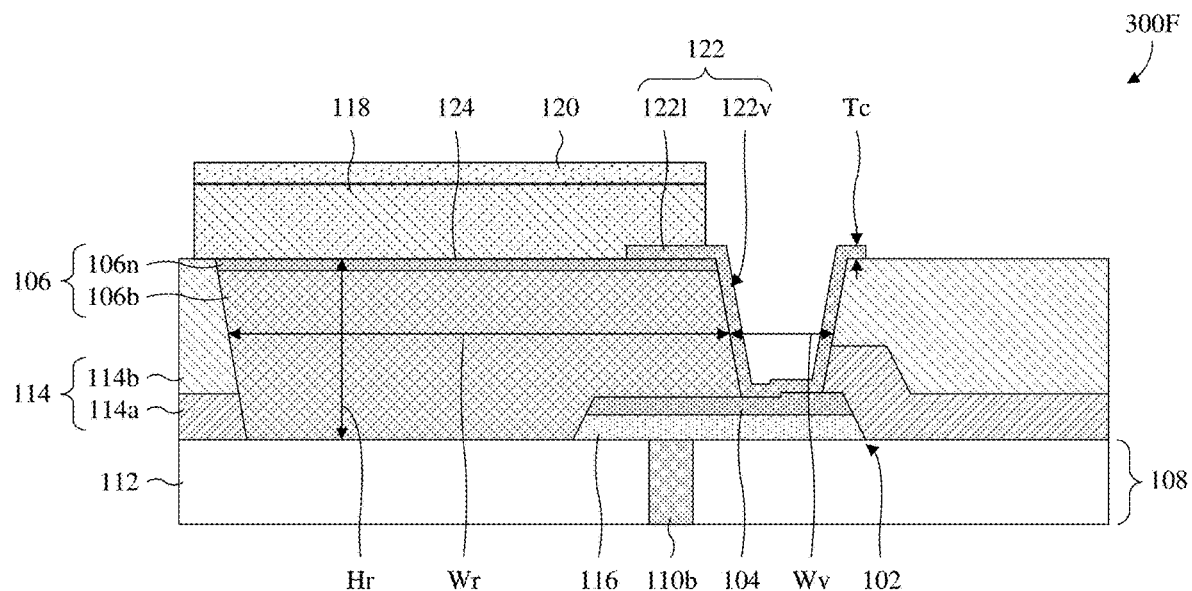

In FIG. 3F, the coupling via 122v directly contacts a sidewall of the reflector 106. Further, a bottom surface of the coupling via 122v has a stepped profile. In alternative embodiments, the bottom surface of the coupling via 122v is flat from a first side of the coupling via 122v to a second side of the coupling via 122v opposite the first side.

Figure 3G:
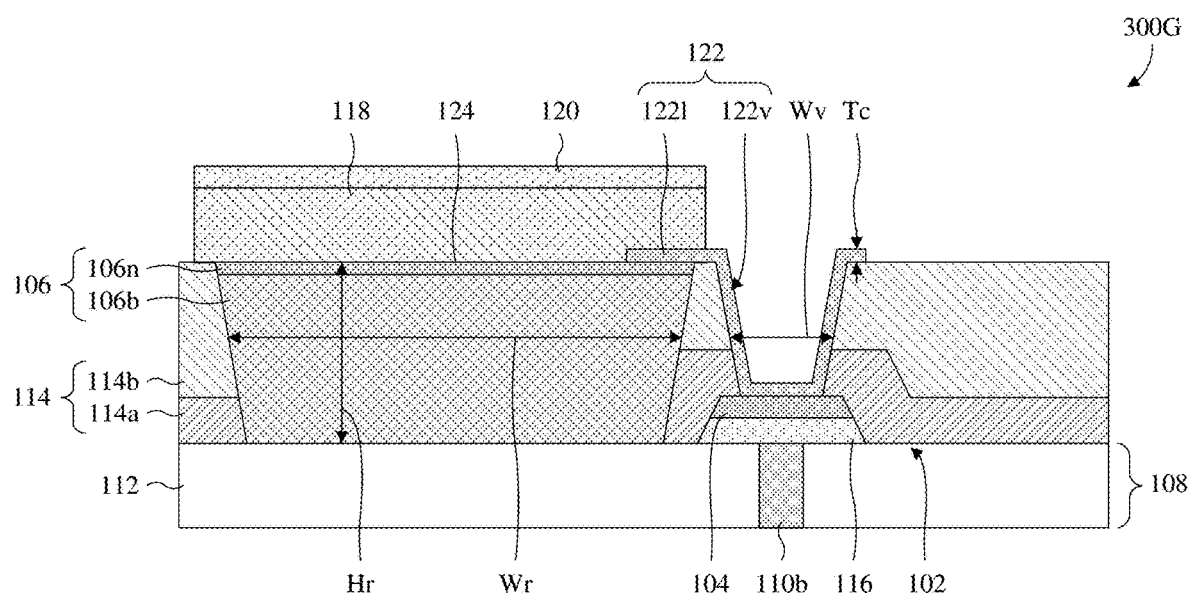

In FIG. 3G, the bottom electrode 104 and the bottom electrode barrier 116 are laterally separated from the reflector 106, such that the reflector 106 does not overlie the bottom electrode 104 and the bottom electrode barrier 116.

Figure 3H:
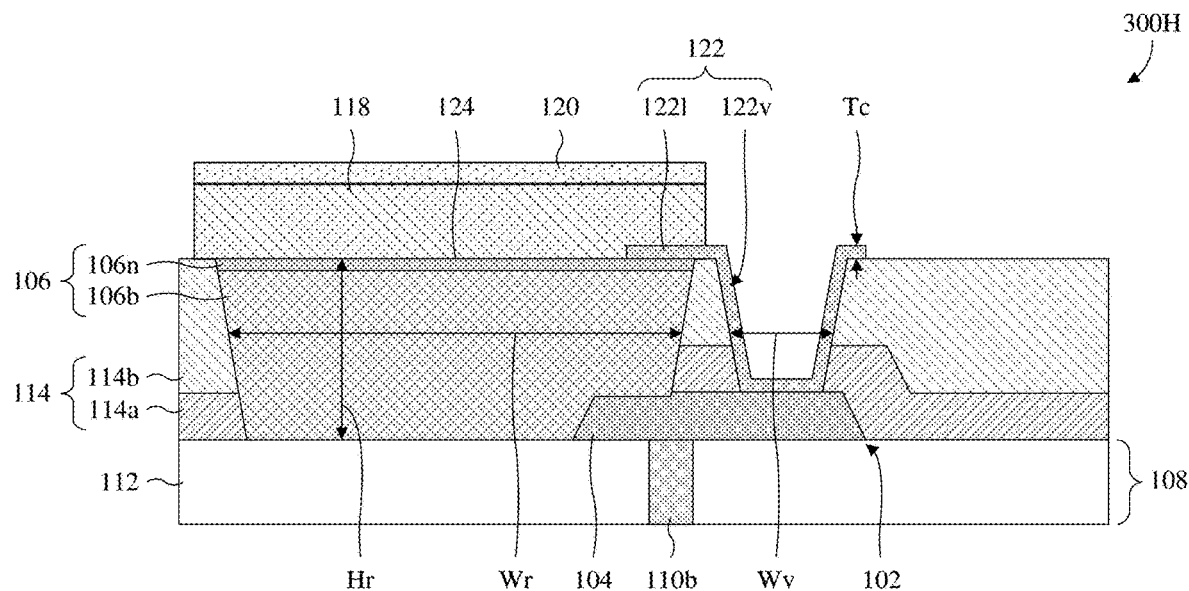

In FIG. 3H, the bottom electrode barrier 116 is omitted. As such, the bottom electrode 104 directly contacts the bottom electrode via 110b.

Figure 3I:
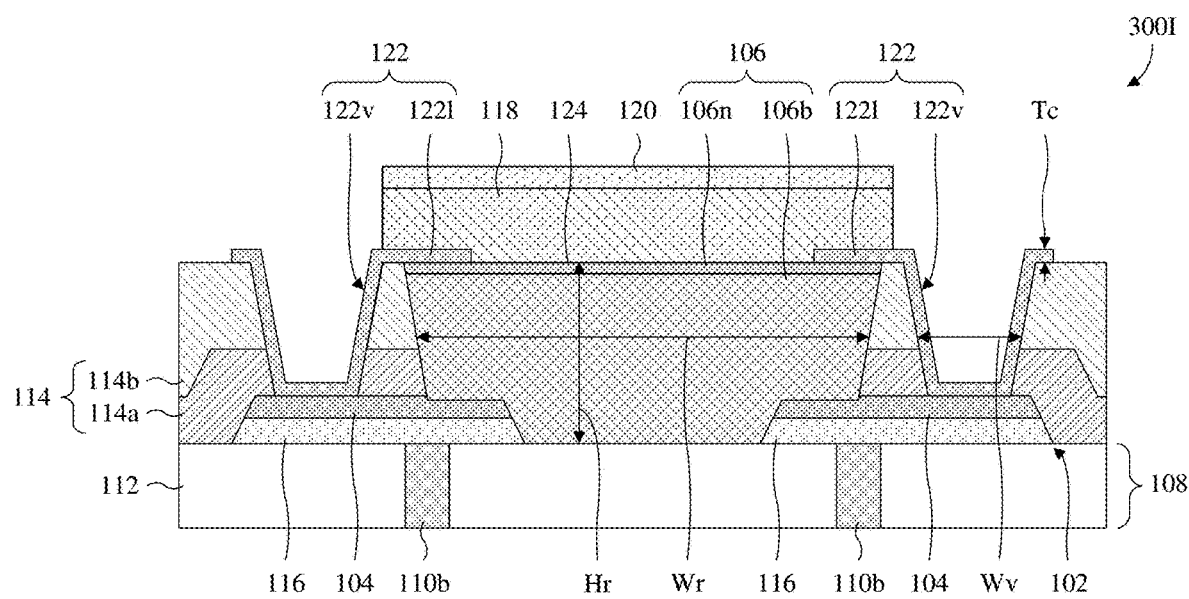

In FIG. 3I, the IC chip comprises a pair of coupling structures 122 respectively on opposite sides of the reflector 106. The coupling structures 122 are individual to and respectively overlie bottom electrodes 104. Further, the coupling structures 122 extend respectively from the bottom electrodes 104, through the pixel dielectric layer 114, to a bottom surface of the light emission device 118 on the opposite sides of the reflector 106.

The bottom electrodes 104 are individual to and respectively overlie bottom electrode vias 110b, which are electrically shorted outside the cross-sectional view 300H of FIG. 3H by the interconnect structure 108. Further, the bottom electrodes 104 are separated from, and electrically coupled to, the bottom electrode vias 110b by bottom electrode barriers 116. The bottom electrodes 104, the bottom electrode vias 110b, the bottom electrode barriers 116, and the coupling structures 122 are as their counterparts are described with regard to FIG. 1.

Because multiple coupling structures 122 and multiple bottom electrodes 104 provide electrical coupling from the bottom surface of the light emission device 118 to the interconnect structure 108, resistance therebetween is reduced. This reduced resistance may, in turn, enhance electrical performance (e.g., power consumption) of the display pixel 102.

While FIGS. 3A-3I describe variations to the display pixel 102 of FIG. 1, any one or combination of the variations may be applied to the display pixel 102 in any of FIGS. 3A-3I. For example, the display pixel 102 of FIG. 3D may alternatively have the bottom electrode 104 and the bottom electrode barrier 116 extending along a bottom surface of the reflector 106, from a first sidewall of the reflector 106 to a second sidewall of the reflector 106 opposite the first sidewall, as illustrated and described with regard to FIG. 3A. As another example, the display pixel 102 of FIG. 3I may alternatively have coupling vias 122v that are solid, instead of U- or V-shaped, illustrated and described with regard to FIG. 3B With reference to FIG. 4, an expanded cross-sectional view 400 of some embodiments of the IC chip of FIG. 1 is provided in which the IC chip comprises a plurality of display pixels 102 and a plurality of semiconductor devices 402. The display pixels 102 are each as described with regard to FIG. 1 and define a display structure.

The semiconductor devices 402 define a display driver circuit configured to drive the display structure. The semiconductor devices 402 are individual to and respectively underlie the display pixels 102. Further, the semiconductor devices 402 are electrically coupled to the individual display pixels 102 by the interconnect structure 108 and are configured to drive the individual display pixels 102. In some embodiments, the semiconductor devices 402 are metal-oxide-semiconductor field-effect transistors (MOSFETs), fin field-effect transistors (finFETs), gate-all-around field-effect transistors (GAA FETs), or some other suitable type of transistors and/or semiconductor devices. The semiconductor devices 402 comprise individual well regions 404, individual pairs of source/drain regions 406, and individual gate electrodes 408.

The well regions 404 are inset into a top of a semiconductor substrate 410 and correspond to doped regions of the semiconductor substrate 410. Further, the well regions 404 have a different doping type and/or a different doping concentration than a bulk of the semiconductor substrate 410. In alternative embodiments, the semiconductor devices 402 share a common well region 404 and/or the well regions 404 are omitted.

The pairs of source/drain regions 406 are inset the top of the semiconductor substrate 410 respectively at the well regions 404. In some embodiments, the source/drain regions 406 correspond to doped regions of the semiconductor substrate 410 having a different doping type as adjoining regions of the semiconductor substrate 410 and/or as the well regions 404. In other embodiments, the source/drain regions 406 are distinct from the semiconductor substrate 410 and have a different semiconductor material than the semiconductor substrate 410. The source/drain regions 406 of each pair are laterally spaced to demarcate a channel region 412 extending between the source/drain regions 406 of that pair.

The gate electrodes 408 respectively overlie the channel regions 412, laterally between corresponding source/drain regions 406. Further, the gate electrodes 408 are separated from the semiconductor substrate 410 by a common gate dielectric layer 414. In alternative embodiments, the gate electrodes 408 are separated from the semiconductor substrate 410 by individual gate dielectric layers 414.

An isolation structure 416 is inset into the top of the semiconductor substrate 410 to laterally separate the semiconductor devices 402 from each other. Further, the isolation structure 416 comprises a dielectric material to provide electrical isolation between the semiconductor devices 402. In some embodiments, the isolation structure 416 is a shallow trench isolation (STI) structure, a field oxide isolation structure, or some other suitable isolation structure.

The interconnect structure 108 is between the display pixels 102 and the semiconductor devices 402 to electrically couple the display pixels 102 respectively to the semiconductor devices 402. The interconnect structure 108 comprises a plurality of wires 418 and a plurality of vias 110, and the plurality of vias 110 comprises bottom electrode vias 110b respectively at the display pixels 102. The wires 418 and the vias 110 are grouped respectively into a plurality of wire levels and a plurality of via levels that are alternatingly stacked from the semiconductor devices 402 to the display pixels 102.

Figure 4:
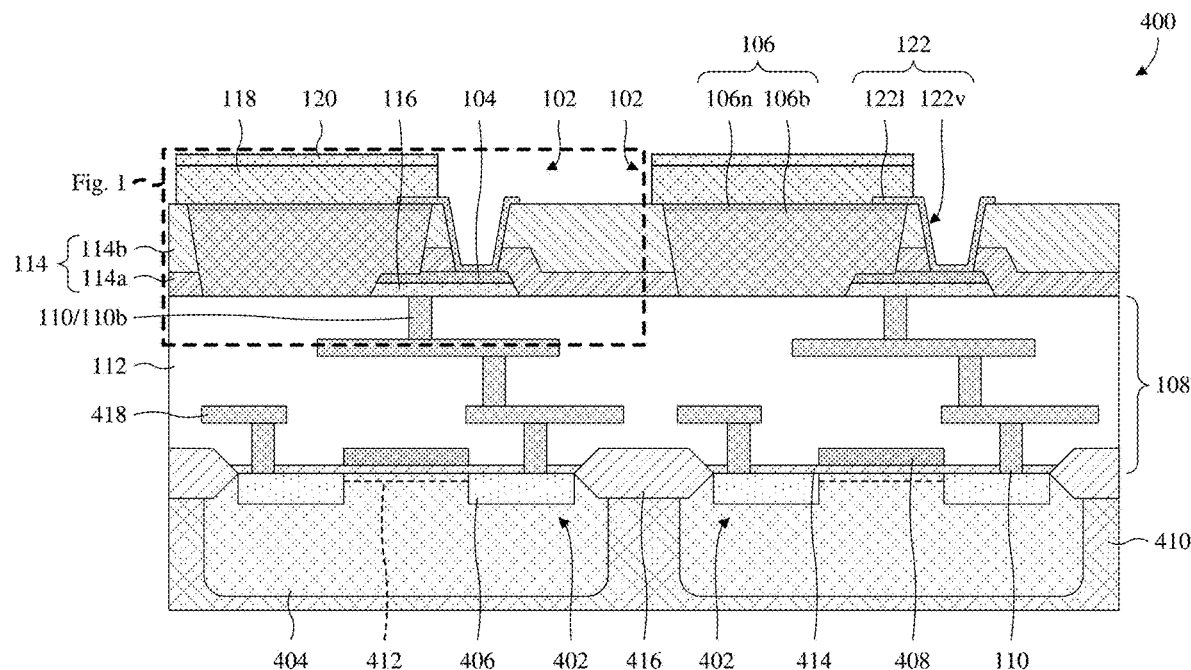
FIG. 4 provides an expanded cross-sectional view of some embodiments of the IC chip of FIG. 1.

While FIG. 4 describes and illustrates the display pixels 102 configured according to the embodiments of FIG. 1, the display pixels 102 may alternatively be configured according to the embodiments in any of FIGS. 3A-3I. Further, while FIG. 4 describes and illustrates the display pixels 102 configured according to the same embodiments, the display pixels 102 may alternatively be configured according to different embodiments. For example, one of the display pixels 102 may be configured according to the embodiments of FIG. 1, whereas another one of the display pixels 102 may be configured according to the embodiments of FIG. 3B.

With reference to FIGS. 5-15, a series of cross-sectional views 500-1500 of some embodiments of a method for forming an IC chip comprising a display pixel is provided in which a bottom electrode and a reflector are separate. The IC chip may, for example, be as illustrated and described with regard to FIG. 4.

Figure 5:
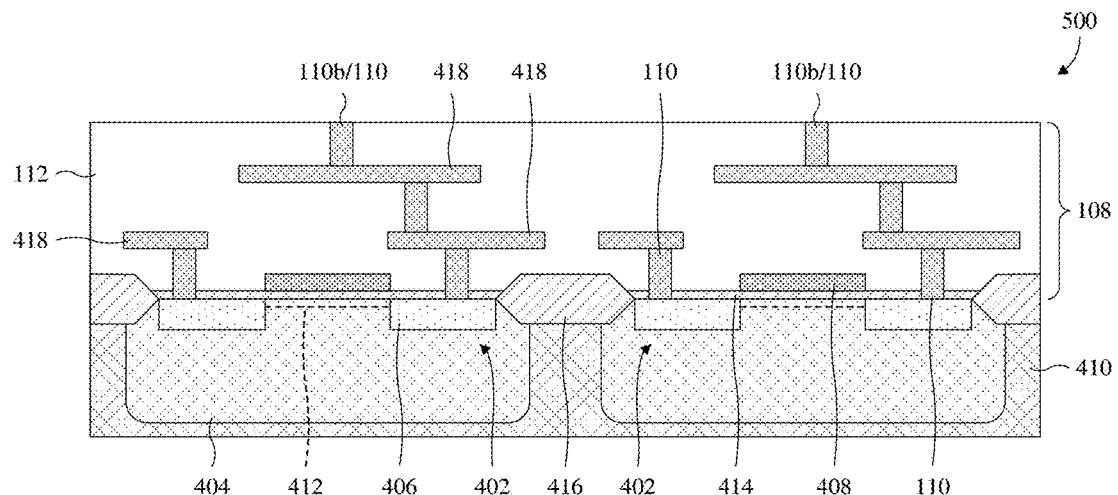
FIGS. 5-15 provide a series of cross-sectional views of some embodiments of a method for forming an IC chip comprising a display pixel in which a bottom electrode and a reflector are separate.

As illustrated by the cross-sectional view 500 of FIG. 5, a plurality of semiconductor devices 402 is formed. The semiconductor devices 402 are formed inset into a top of a semiconductor substrate 410, separated from each other by an isolation structure 416. The semiconductor devices 402 and the isolation structure 416 are as described with regard to FIG. 4. For example, the semiconductor devices 402 may be MOSFETs, fin FETs, GAA FETs, or some other suitable type of semiconductor device.

Also illustrated by the cross-sectional view 500 of FIG. 5, an interconnect structure 108 is formed covering and electrically coupled to the semiconductor devices 402. The interconnect structure 108 comprises a plurality of wires 418 and a plurality of vias 110 inset into an interconnect dielectric layer 112. The wires 418 and the vias 110 are respectively grouped into a plurality of wire levels and a plurality of via levels that are alternatingly stacked to define conductive paths leading respectively from the semiconductor devices 402 respectively to bottom electrode vias 110b at a top of the interconnect structure 108. The bottom electrode vias 110b are individual to and respectively overlie the semiconductor devices 402.

Figure 6:
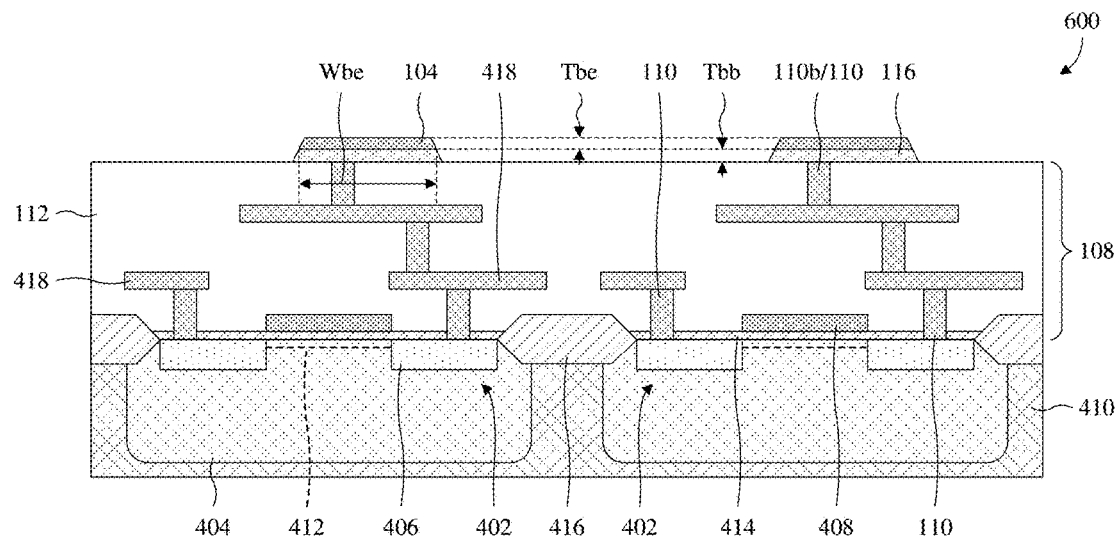

As illustrated by the cross-sectional view 600 of FIG. 6, a plurality of bottom electrodes 104 and a plurality of bottom electrode barriers 116 are formed overlying and electrically coupled to the interconnect structure 108. In alternative embodiments, the plurality of bottom electrode barriers 116 is not formed. The bottom electrode barriers 116 respectively overlie and electrically couple to the bottom electrode vias 110b, and the bottom electrodes 104 respectively overlie and electrically couple to the bottom electrode barriers 116. Therefore, the bottom electrodes 104 electrically couple respectively to the bottom electrode vias 110b through the bottom electrode barriers 116.

The bottom electrode barriers 116 are conductive and are diffusion barriers for material of the bottom electrode vias 110b. For example, when the bottom electrode vias 110b are or comprise tungsten, the bottom electrode barriers 116 may be or comprise titanium nitride or some other suitable barrier material. As another example, when the bottom electrode vias 110b are or comprise copper, the bottom electrode barriers 116 may be or comprise tantalum nitride or some other suitable barrier material.

In some embodiments, a thickness Tbb of the bottom electrode barriers 116 is about 10-10000 angstroms, about 10-5000 angstroms, about 50-10000 angstroms, or some other suitable amount. If the thickness Tbb is too large (e.g., more than about 10000 angstroms), resistance from the bottom electrode vias 110b to the bottom electrodes 104 may be high and electrical performance (e.g., power consumption) may be poor. If the thickness Tbb is too small (e.g., less than about 10 angstroms), the bottom electrode barriers 116 may be unsuitable for blocking diffusion of material of the bottom electrode vias 110b.

The bottom electrodes 104 may, for example, be or comprise tantalum nitride (e.g., TaN), titanium nitride (e.g., TiN), ITO, platinum (e.g., Pt), gold (e.g., Au), some other suitable metal(s) and/or conductive material(s), or any combination of the foregoing. In some embodiments, the bottom electrodes 104 are or comprise a noble metal and/or an inert metal. In some embodiments, the bottom electrodes 104 have low reactivities with oxygen. For example, the bottom electrodes 104 may depend on more than about 5 eV, 6 eV, or some other suitable amount of energy to react with oxygen. In some embodiments, native oxide of the bottom electrodes 104 (to the extent it forms) is conductive.

In some embodiments, a thickness Tbe of the bottom electrodes 104 is about 10-10000 angstroms, about 10-5000 angstroms, about 50-10000 angstroms, or some other suitable amount. If the thickness Tbe is too large (e.g., more than about 10000 angstroms), resistance from bottom surfaces of the bottom electrodes 104 to top surfaces of the bottom electrodes 104 may be high and electrical performance (e.g., power consumption) may be poor. In some embodiments, a width Wbe of the bottom electrodes 104 is about 50-50000 nanometers, about 50-25000 nanometers, about 25000-50000 nanometers, or some other suitable amount. If the width Wbe is too small (e.g., less than about 50 nanometers), landing subsequently formed coupling vias on the bottom electrodes 104 may be challenging, whereby electrical opens may occur and yields may be low. If the width Wbe is too large (e.g., more than about 50 micrometers), pixel density may be low, thereby increasing costs.

A process for forming the plurality of bottom electrodes 104 and the plurality of bottom electrode barriers 116 comprises: 1) depositing a barrier layer covering the interconnect structure 108; 2) depositing an electrode layer covering the barrier layer; and 3) patterning the barrier layer and the electrode layer respectively into the bottom electrodes 104 and the bottom electrode barriers 116. The patterning may, for example, be performed by a photolithography/etching process or by some other suitable selective etching and/or patterning process. In alternative embodiments, the plurality of bottom electrodes 104 and the plurality of bottom electrode barriers 116 are formed by some other suitable process.

Figure 7:
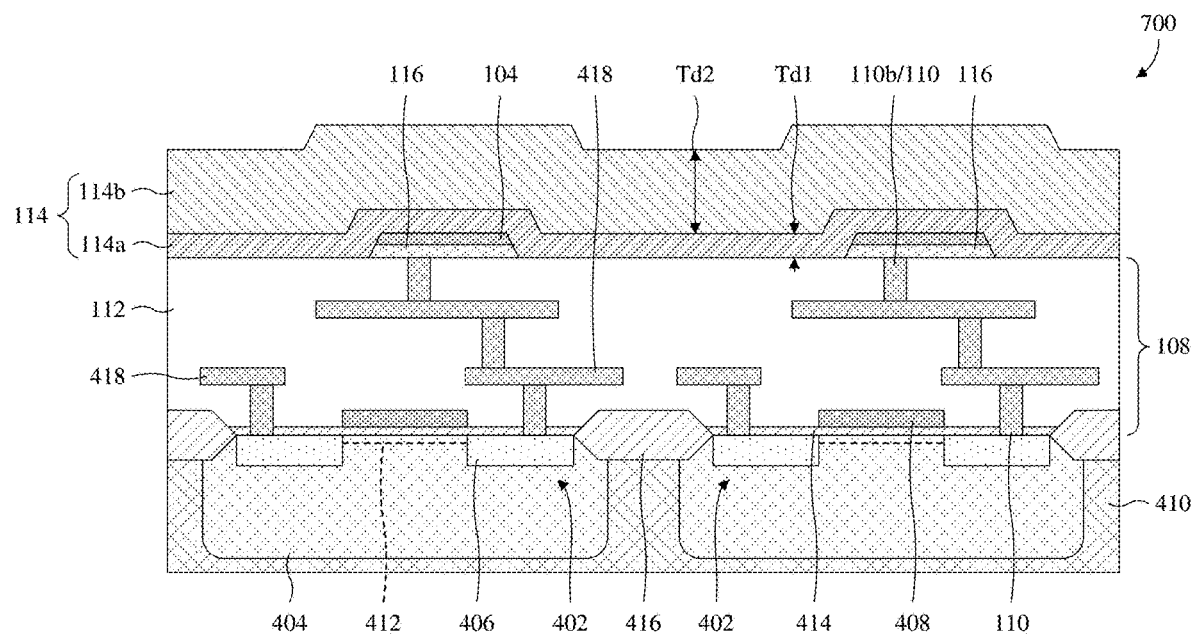

As illustrated by the cross-sectional view 700 of FIG. 7, a pixel dielectric layer 114 is deposited covering the interconnect structure 108 and the bottom electrodes 104. Further, the pixel dielectric layer 114 is deposited conforming to the bottom electrodes 104, such that a top surface of the pixel dielectric layer 114 is uneven. The pixel dielectric layer 114 comprises a first dielectric layer 114a and a second dielectric layer 114b overlying the first dielectric layer 114a. In alternative embodiments, the first or second dielectric layer 114a, 114b is omitted. The first and second dielectric layers 114a, 114b are different materials. For example, the first dielectric layer 114a may be or comprise silicon nitride and/or some other suitable nitride, and/or the second dielectric layer 114b may be or comprise silicon oxide and/or some other suitable oxide, or vice versa. Note that other materials are amenable.

In some embodiments, a thickness Td1 of the first dielectric layer 114a is about 100-10000 angstroms, about 100-5000 angstroms, about 5000-10000 angstroms, or some other suitable amount. Additionally, in some embodiments, a thickness Td2 of the second dielectric layer 114b is about 1000-10000 angstroms, about 1000-5500 angstroms, about 5500-1000 5500-10000 angstroms, or some other suitable amount.

Figure 8:
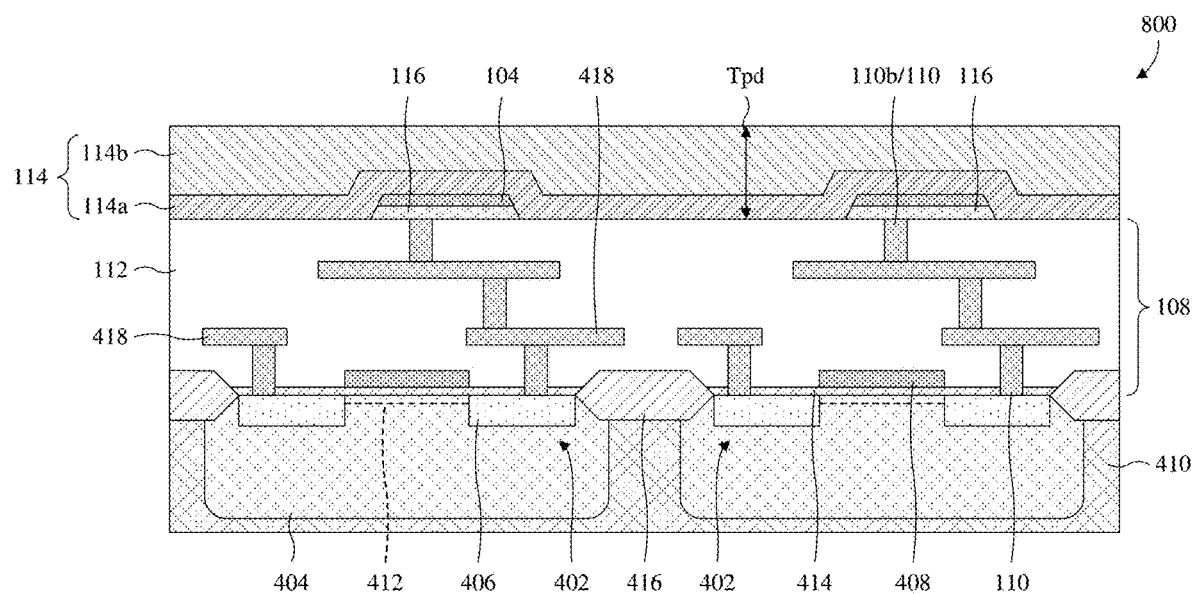

As illustrated by the cross-sectional view 800 of FIG. 8, a planarization is performed into the pixel dielectric layer 114 to flatten a top surface of the pixel dielectric layer 114. As a result of the planarization, a thickness Tpd of the pixel dielectric layer 114 is smaller directly over the bottom electrodes 104 than laterally off to sides of the bottom electrodes 104. The planarization may, for example, be performed by a chemical mechanical polish (CMP) or by some other suitable planarization process.

Figure 9:
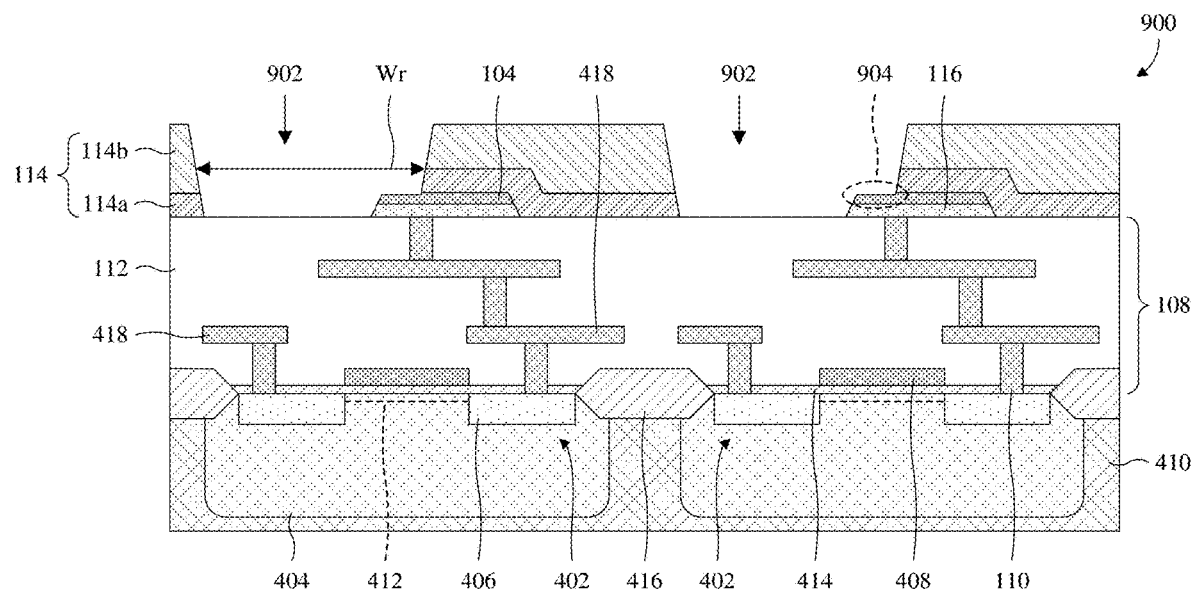

As illustrated by the cross-sectional view 900 of FIG. 9, the pixel dielectric layer 114 is patterned to form a plurality of reflector openings 902. The reflector openings 902 are individual to and respectively overlie the semiconductor devices 402. Further, the reflector openings 902 expose a top surface of the interconnect dielectric layer 112 and a top surface of the bottom electrodes 104. In alternative embodiments, the reflector openings 902 are localized over the bottom electrodes 104, such that the reflector openings 902 expose the bottom electrodes 104 but not the interconnect dielectric layer 112. Such alternative embodiments may, for example, arise when forming display pixels according to embodiments in FIG. 3A or 3B. In alternative embodiments, the reflector openings 902 are spaced from the bottom electrodes 104, such that the reflector openings 902 expose the interconnect dielectric layer 112 but not the bottom electrodes 104. Such alternative embodiments may, for example, arise when forming display pixels according to embodiments in FIG. 3G.

In some embodiments, the patterning recesses top surface portions 904 of the bottom electrodes 104 that are exposed in the reflector openings 902, such that top surfaces of the bottom electrodes 104 have stepped profiles. In alternative embodiments, the top surfaces are flat upon completion of the patterning. In some embodiment, a width Wr of the reflector openings 902 is about 100-50000 nanometers, about 100-25000 nanometers, about 25000-50000 nanometers, or some other suitable amount.

The patterning may, for example, be performed by a photolithography/etching process or by some other suitable selective etching and/or patterning process. The etching of the photolithography/etching process may, for example, be performed by dry etching, wet etching, some other suitable type of etching, or any combination of the foregoing.

Figure 10:
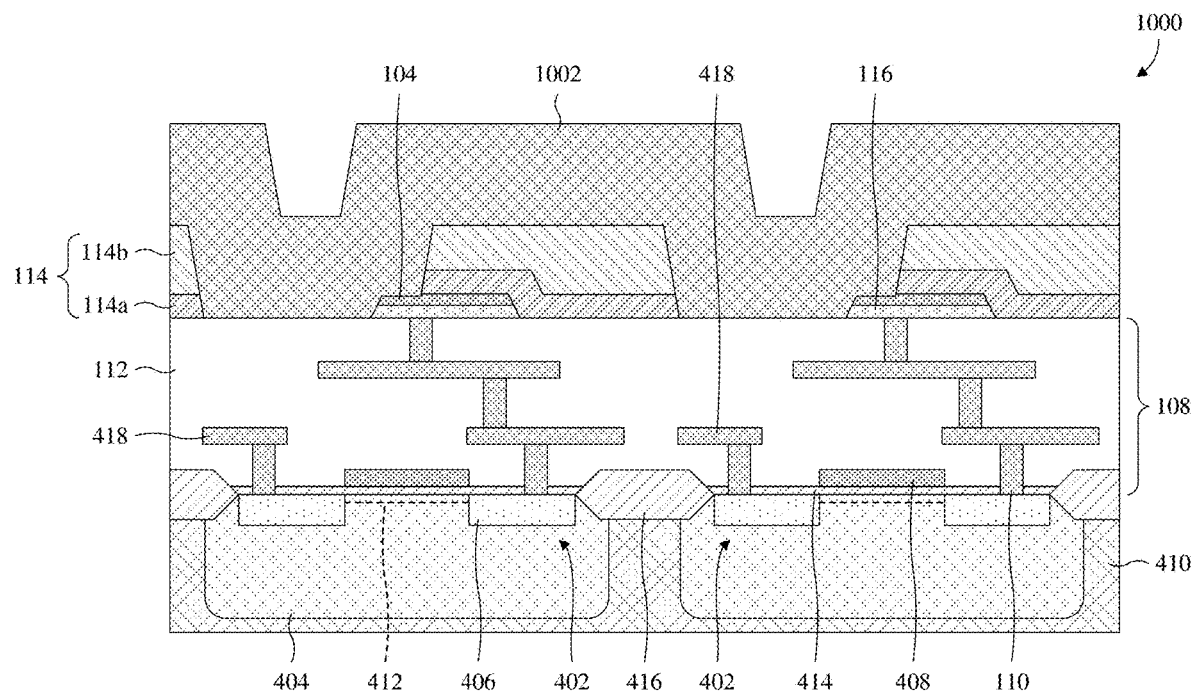

As illustrated by the cross-sectional view 1000 of FIG. 10, a reflector layer 1002 is deposited covering the pixel dielectric layer 114 and filling the reflector openings 902 (see, e.g., FIG. 9). Further, the reflector layer 1002 is deposited conforming to the topography of the IC chip, such that a top surface of the reflector layer 1002 is uneven. The reflector layer 1002 is conductive and may, for example, be or comprise aluminum, some other suitable metal(s) and/or conductive material(s), or any combination of the foregoing. In alternative embodiments, the reflector layer 1002 is dielectric. The reflector layer 1002 may be dielectric because the reflector layer 1002 is not employed for electrically coupling subsequently formed light emission devices to the interconnect structure 108. While the reflector layer 1002 may be dielectric, note that metals are generally more reflective than dielectrics.

In some embodiments, the reflector layer 1002 is more reflective than the bottom electrodes 104 for radiation emitted by the subsequently formed light emission devices. For example, the reflector layer 1002 may reflect a greater percentage of incident radiation from the light emission devices than the bottom electrodes 104. In some embodiments, the reflector layer 1002 is more reactive with oxygen than the bottom electrodes 104. For example, the reflector layer 1002 may depend on less energy to react with oxygen than the bottom electrodes 104. In some embodiments, the reflector layer 1002 depends on less than about 4 eV, 3 eV, or some other suitable amount of energy to react with oxygen, and/or the bottom electrodes 104 depend on more than about 5 eV, 6 eV, or some other suitable amount of energy to react with oxygen. In some embodiments, native oxide of the reflector layer 1002 is dielectric and/or has a greater resistivity than native oxide of the bottom electrodes 104.

Figure 11:
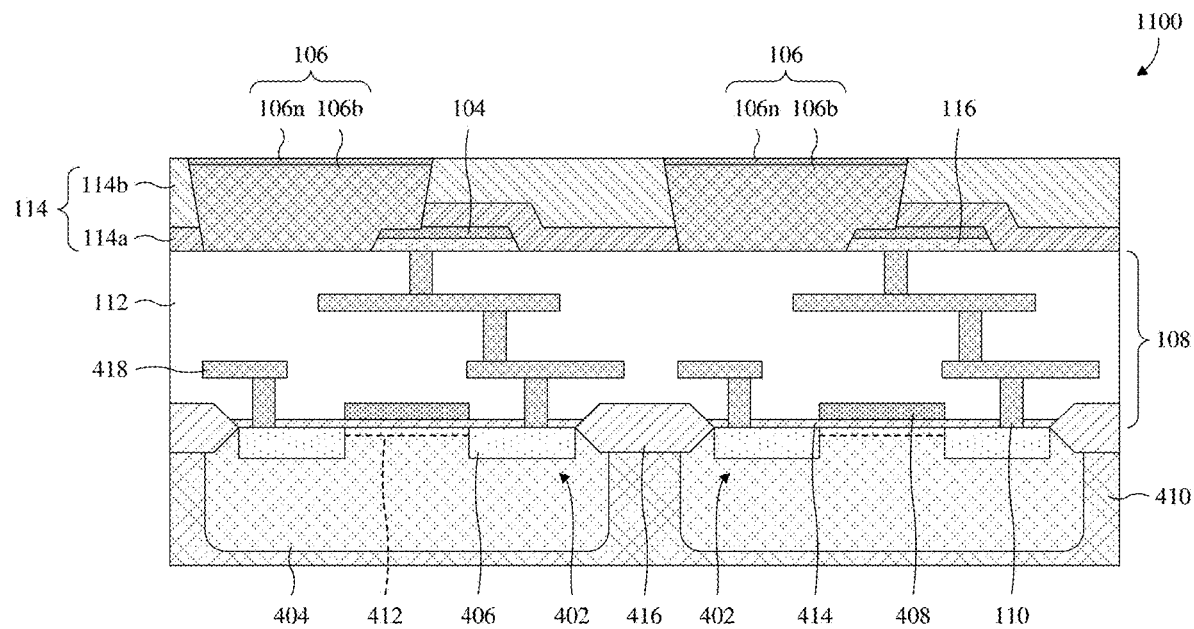

As illustrated by the cross-sectional view 1100 of FIG. 11, a planarization is performed into the reflector layer 1002 (see, e.g., FIG. 10) to flatten a top surface of the reflector layer 1002 and to localize the reflector layer 1002 to the reflector openings 902 (see, e.g., FIG. 9). Further, the planarization forms a plurality of reflectors 106 from portions of the reflector layer 1002 localized to the reflector openings 902. The reflectors 106 are individual to and respectively fill the reflector openings 902. Further, the reflectors 106 comprise individual conductive bodies 106b and individual native oxide layers 106n. The planarization may, for example, be performed by a CMP or by some other suitable planarization process.

The conductive bodies 106b are a same material as the reflector layer 1002. The native oxide layers 106n respectively overlie the conductive bodies 106b and form from oxidation of the conductive bodies 106b during the planarization. In alternative embodiments, the native oxide layers 106n form during subsequent processing, such that the native oxide layers 106n are not present. Further, the native oxide layers 106n are native oxide of the reflector layer 1002. In some embodiments, the conductive bodies 106b are or comprise aluminum, whereas the native oxide layers 106n are or comprise aluminum oxide. Other suitable materials are, however, amenable. In some embodiments, the native oxide layers 106n are dielectric and/or have a greater resistivity than native oxide of the bottom electrodes 104.

Figure 12:
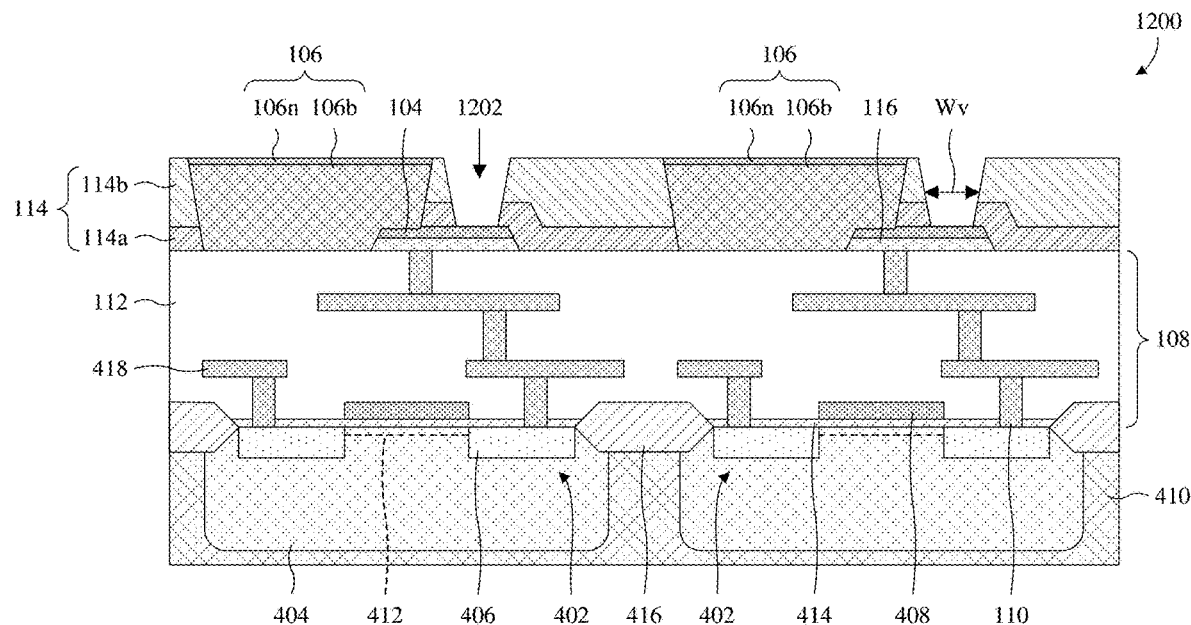

As illustrated by the cross-sectional view 1200 of FIG. 12, the pixel dielectric layer 114 is patterned to form a plurality of via openings 1202. The via openings 1202 are individual to and respectively overlie the bottom electrodes 104. Further, the via openings 1202 expose a top surface of the bottom electrodes 104 and are spaced from the reflectors 106. In alternative embodiments, the via openings 1202 overlap with the reflectors 106 and expose sidewalls of the reflectors 106.

In some embodiment, a width Wv of the via openings 1202 is about 100-1000 nanometers, about 100-550 nanometers, about 550-1000 nanometers, or some other suitable amount. If the width Wv is too small (e.g., less than about 50 nanometers), process control during formation of the via openings 1202 may be overly hard and manufacturing yields may be low. If the width Wv is too large (e.g., more than about 1000 nanometers), pixel density may be low. Further, topography at the via openings 1202 may have a high degree of variation that may pose processing challenges and degrade manufacturing yields.

The patterning may, for example, be performed by a photolithography/etching process or by some other suitable selective etching and/or patterning process. The etching of the photolithography/etching process may, for example, be performed by dry etching, wet etching, some other suitable type of etching, or any combination of the foregoing.

Figure 13:
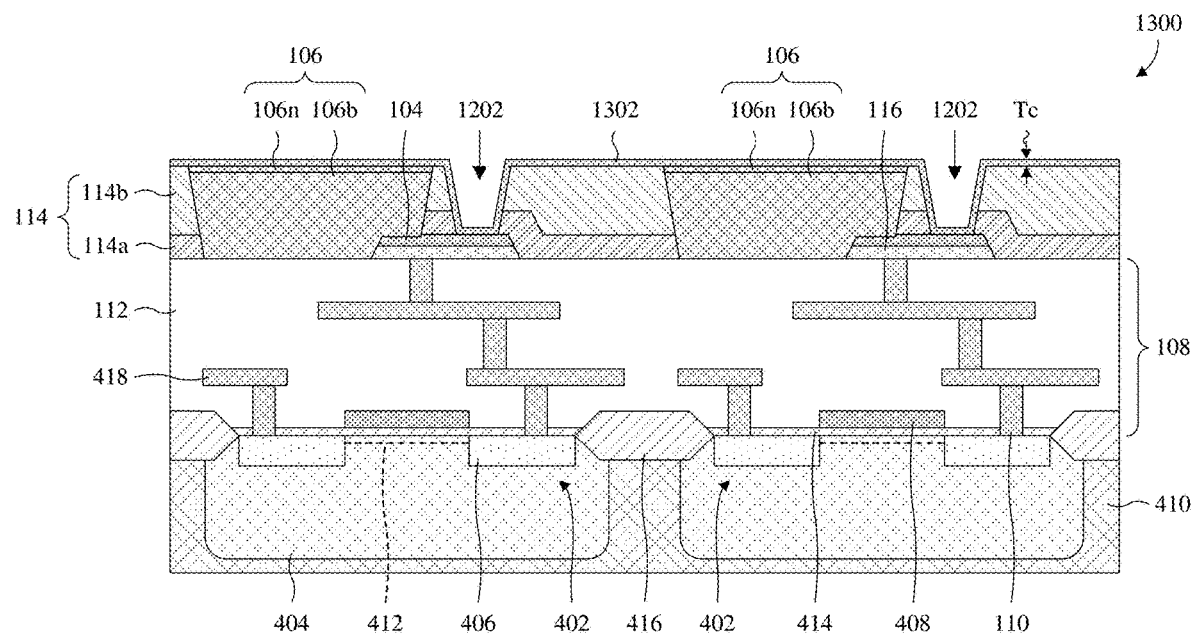

As illustrated by the cross-sectional view 1300 of FIG. 13, a conductive layer 1302 is deposited covering the reflectors 106 and the pixel dielectric layer 114. Further, the conductive layer 1302 is deposited lining and partially filling the via openings 1202. The conductive layer 1302 may, for example, be or comprise tantalum nitride (e.g., TaN), titanium nitride (e.g., TiN), ITO, platinum (e.g., Pt), gold (e.g., Au), some other suitable metal(s) and/or conductive material(s), or any combination of the foregoing. In some embodiments, the conductive layer 1302 is or comprises a noble metal and/or an inert metal. The conductive layer 1302 may, for example, be the same material as or a different material than the bottom electrodes 104.

In some embodiments, the conductive layer 1302 is less reflective than the reflectors 106 for radiation emitted by the subsequently formed light emission devices. For example, the conductive layer 1302 may reflect a greater percentage of incident radiation from the light emission devices than the reflectors 106. In some embodiments, the conductive layer 1302 is less reactive with oxygen than the reflectors 106. For example, the conductive layer 1302 may depend on more energy to react with oxygen than the reflectors 106. In some embodiments, the conductive layer 1302 depends on more than about 5 eV, 6 eV, or some other suitable amount of energy to react with oxygen, and/or the reflectors 106 depend on less than about 3 eV, 4 eV, or some other suitable amount of energy to react with oxygen. In some embodiments, native oxide of conductive layer 1302 is conductive and/or has a lesser resistivity than the native oxide layers 106n of the reflectors 106. In some embodiments, the conductive layer 1302 is transparent to radiation emitted by the subsequently formed light emission devices.

In some embodiments, a thickness Tc of the conductive layer 1302 is about 50-1000 angstroms, about 50-500 angstroms, about 500-1000 angstroms, or some other suitable amount. If the thickness Tc is too small (e.g., less than about 50 angstroms), resistance from the bottom electrodes 104 to subsequently formed light emission devices may be high and electrical performance may be poor. If the thickness Tc is too large (e.g., more than about 1000 angstroms), material may be wasted and throughput may be degraded.

Figure 14:
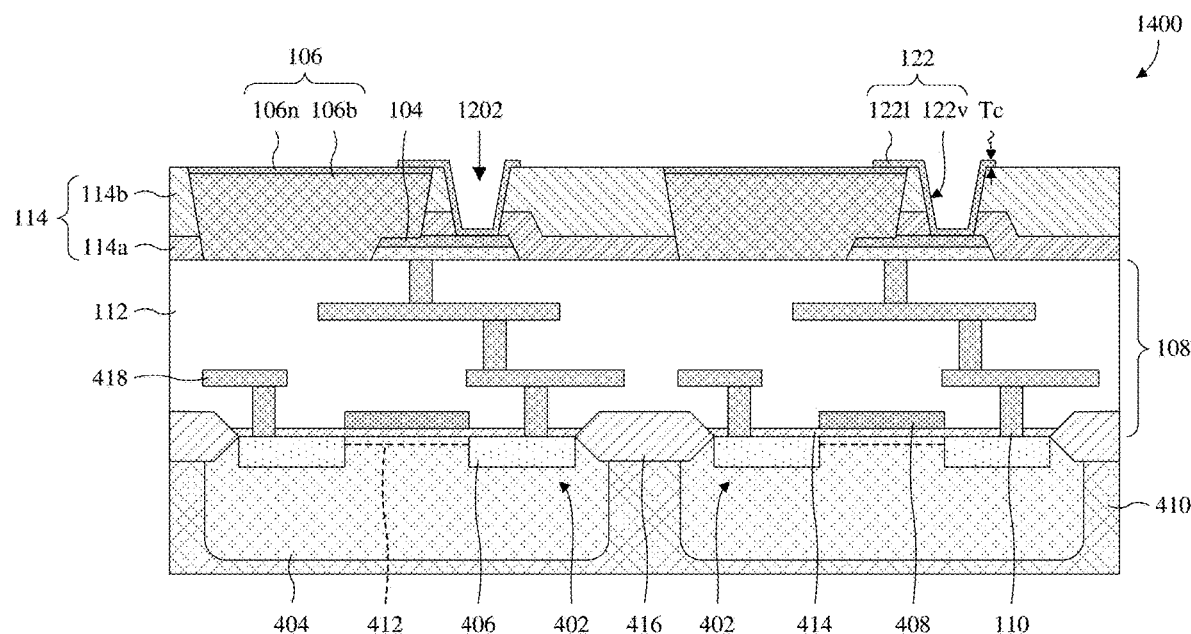

As illustrated by the cross-sectional view 1400 of FIG. 14, the conductive layer 1302 (see, e.g., FIG. 13) is patterned to form a plurality of coupling structures 122. The coupling structures 122 provide electrical coupling to subsequently formed light emission devices and extend respectively from the bottom electrodes 104, respectively through the via openings 1202, respectively to top surfaces of the reflectors 106. Further, the coupling structures 122 partially cover the reflectors 106 and comprise individual coupling layers 1221 and individual coupling vias 122v. The coupling vias 122v are portions of the corresponding coupling layers 1221 that have top indents and that extend through the pixel dielectric layer 114. In alternative embodiments, the coupling layers 1221 fully cover the corresponding reflectors 106. Such alternative embodiments may, for example, arise when forming display pixels according to embodiments in FIG. 3C-3E.

The patterning may, for example, be performed by a photolithography/etching process or by some other suitable selective etching and/or patterning process. The etching of the photolithography/etching process may, for example, be performed by dry etching, wet etching, some other suitable type of etching, or any combination of the foregoing.

Figure 15:
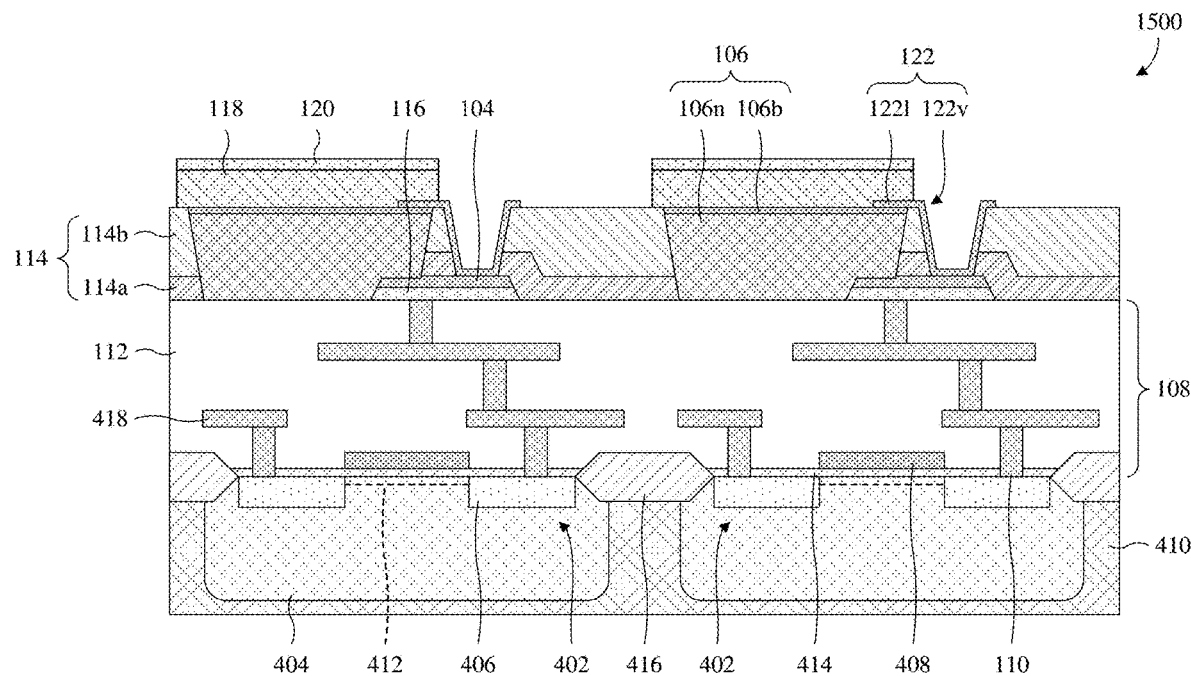

As illustrated by the cross-sectional view 1500 of FIG. 15, a plurality of light emission devices 118 and a plurality of top electrodes 120 are formed. The light emission devices 118 respectively overlie the reflectors 106 and have bottom surfaces respectively and directly contacting the coupling structures 122. As such, the coupling structures 122 respectively and electrically couple the bottom surfaces respectively to the bottom electrodes 104. The top electrodes 120 respectively overlie the light emission devices.

The top electrode 120 is transparent and may, for example, be or comprise gold (e.g., Au), silver (e.g., Ag), indium tin oxide (ITO), some other suitable conductive material(s), or any combination of the foregoing. The light emission device 118 may, for example, be a microLED, an OLED, a LED, or some other suitable device. An optional dielectric layer may be formed on the pixel dielectric layer 114 and fills the openings of the coupling vias 122v.

Because the bottom electrodes 104 and the reflectors 106 are separate, and because the coupling structures 122 extend from the bottom electrodes 104 to the bottom surfaces of the light emission devices 118, electrical coupling from the bottom surfaces to the interconnect structure 108 is through the bottom electrodes 104 and the coupling structures 122 rather than through the reflector 106. As such, materials respectively of the reflectors 106, the bottom electrodes 104, and the coupling structures 122 may be chosen so as to both achieve good optical performance and prevent oxidation from causing electrical opens from the bottom electrodes 104 to the bottom surfaces of the light emission devices 118.

Material of the reflectors 106 may be chosen so it has a high reflectivity even though it may also have a high reactivity with oxygen and even though it may oxidize to form native oxide that is dielectric. The high reflectivity may promote good optical performance. Materials respectively of the bottom electrodes 104 and the coupling structures 122 may be chosen so the materials have low reactivity with oxygen and oxidize to form native oxide that is conductive even though the materials may have low reflectivity. The low reactivity and the conductive native oxide may prevent native oxide from causing electrical opens from the bottom electrodes 104 to the bottom surfaces of the light emission devices 118, whereby bulk manufacturing yields may be high. Also, note that metal that has a low reactivity with oxygen and/or that oxidizes to form native oxide that is conductive tends to have low reflectance.

While FIGS. 5-15 are described with reference to various embodiments of a method, it will be appreciated that the structures shown in FIGS. 5-15 are not limited to the method but rather may stand alone separate of the method. While FIGS. 5-15 are described as a series of acts, it will be appreciated that the order of the acts may be altered in other embodiments. While FIGS. 5-15 illustrate and describe as a specific set of acts, some acts that are illustrated and/or described may be omitted in other embodiments. Further, acts that are not illustrated and/or described may be included in other embodiments.

Figure 16:
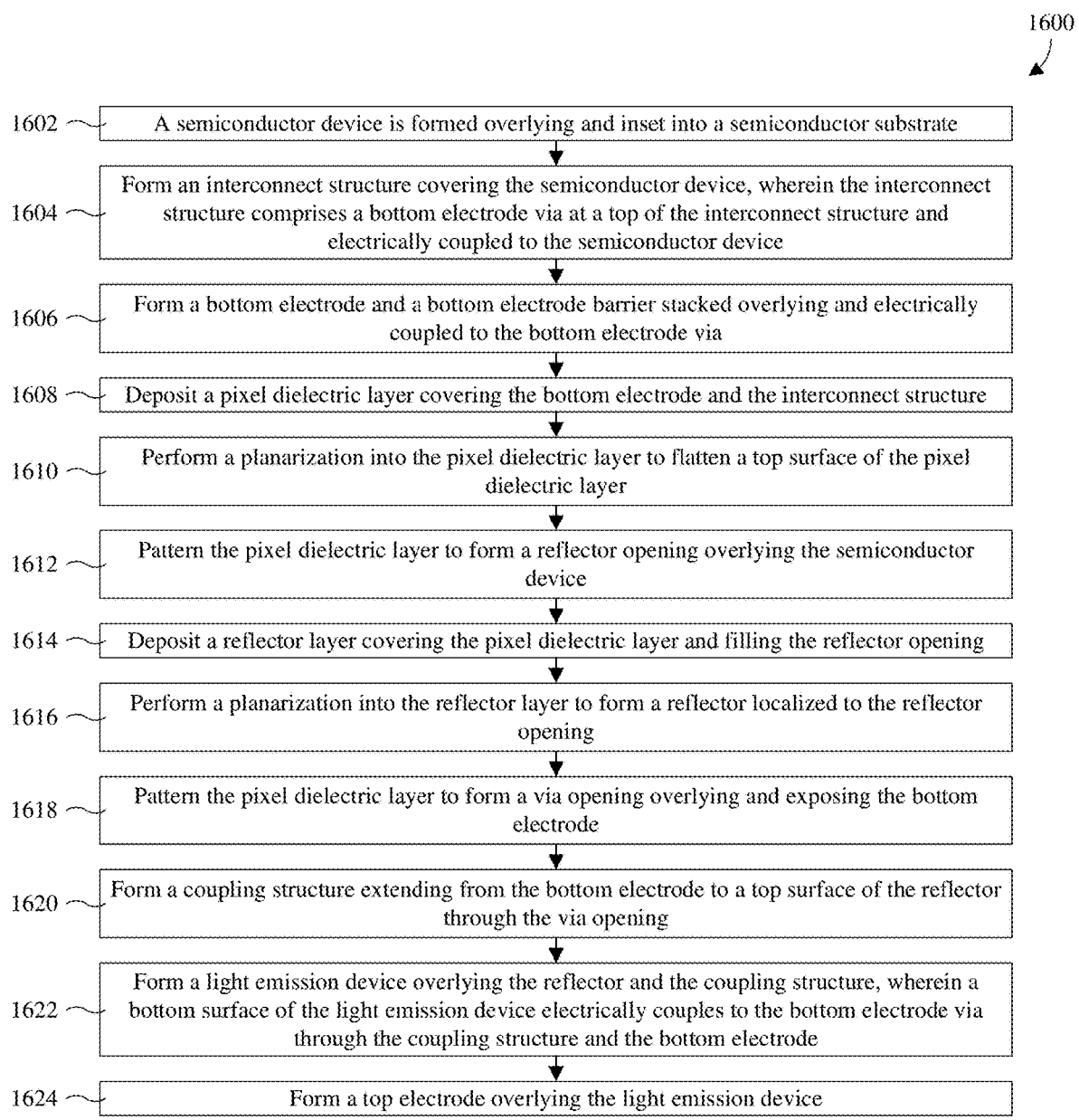
FIG. 16 provides a block diagram of some embodiments of the method of FIGS. 5-15.
Figure 17:
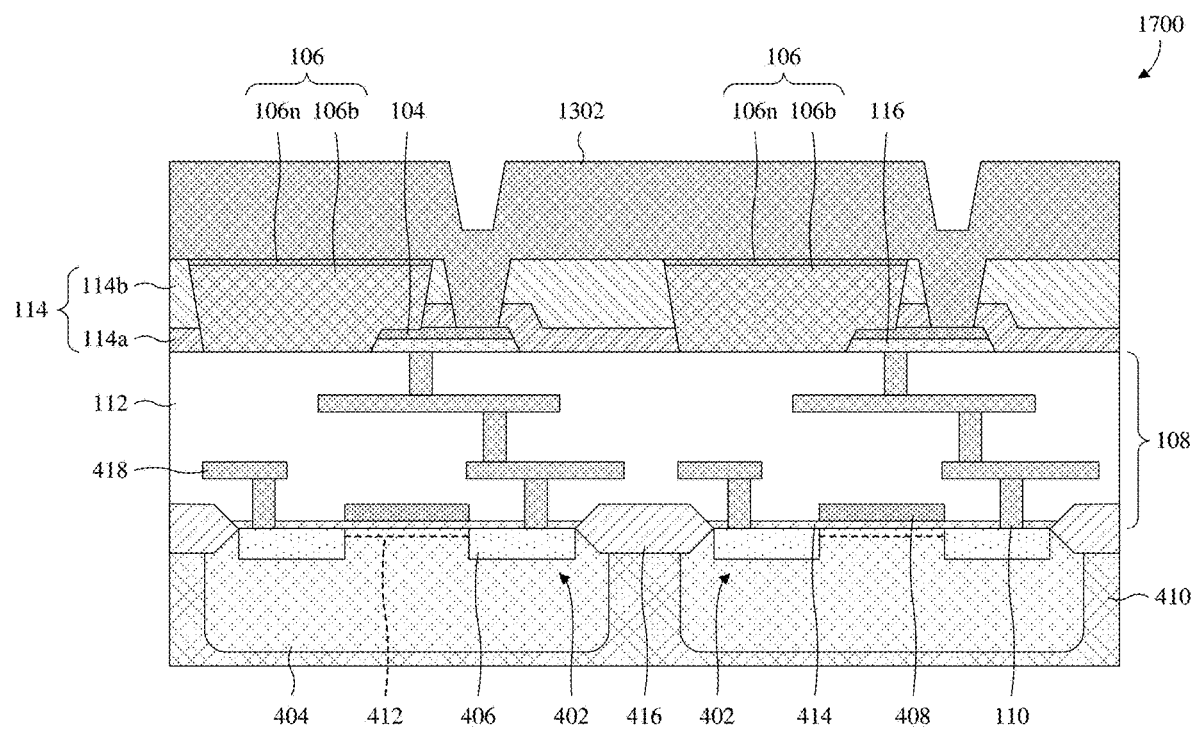
FIGS. 17-21 provide a series of cross-sectional views of some alternative embodiments of the method of FIGS. 5-15.

With reference to FIG. 16, a block diagram 1600 of some embodiments of the method of FIGS. 5-15 is provided.

At 1602, a semiconductor device is formed overlying and inset into a semiconductor substrate. See, for example, FIG. 5.

At 1604, an interconnect structure is formed covering the semiconductor device, wherein the interconnect structure comprises a bottom electrode via at a top of the interconnect structure and electrically coupled to the semiconductor device. See, for example, FIG. 5.

At 1606, a bottom electrode and a bottom electrode barrier are formed stacked overlying and electrically coupled to the bottom electrode via. See, for example, FIG. 6.

At 1608, a pixel dielectric layer is deposited covering the bottom electrode and the interconnect structure. See, for example, FIG. 7.

At 1610, a planarization is performed into the pixel dielectric layer to flatten a top surface of the pixel dielectric layer. See, for example, FIG. 8.

At 1612, the pixel dielectric layer is patterned to form a reflector opening overlying the semiconductor device. See, for example, FIG. 9.

At 1614, a reflector layer is deposited covering the pixel dielectric layer and filling the reflector opening. See, for example, FIG. 10.

At 1616, a planarization is performed into the reflector layer to form a reflector localized to the reflector opening. See, for example, FIG. 11.

At 1618, the pixel dielectric layer is patterned to form a via opening overlying and exposing the bottom electrode. See, for example, FIG. 12.

At 1620, a coupling structure is formed extending from the bottom electrode to a top surface of the reflector through the via opening. See, for example, FIGS. 13 and 14. The forming of the coupling structure may, for example, comprise: depositing a conductive layer covering the reflector and lining the via opening (see, e.g., FIG. 13); and patterning the conductive layer (see, e.g., FIG. 14).

At 1622, a light emission device is formed overlying the reflector and the coupling structure, wherein a bottom surface of the light emission device electrically couples to the bottom electrode via through the coupling structure and the bottom electrode. See, for example, FIG. 15.

At 1624, a top electrode is formed overlying the light emission device. See, for example, FIG. 15.

While the block diagram 1600 of FIG. 16 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 17-21, a series of cross-sectional views 1700-2100 of some alternative embodiments of the method of FIGS. 5-15 is provided in which the coupling vias 122v fully fill the via openings 1202. The alternative embodiments may, for example, form the display pixels as in FIG. 3E.

The acts described with regard to FIGS. 5-12 are unchanged in the alternative embodiments. Therefore, in accordance with the alternative embodiments, the acts described with regard to FIGS. 5-12 are performed as illustrated and described above. Thereafter, as illustrated by the cross-sectional view 1700 of FIG. 17, the acts described with regard to FIG. 13 are performed, except that the conductive layer 1302 is deposited fully filling the via openings 1202 (see, e.g., FIG. 12).

Figure 18:
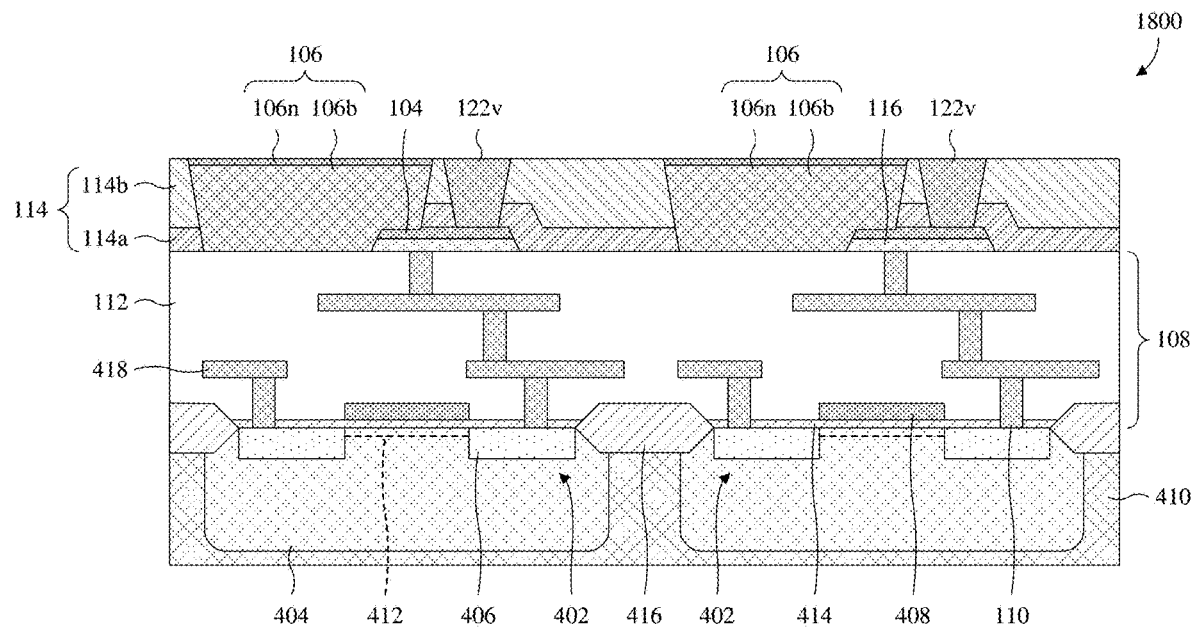

As illustrated by the cross-sectional view 1800 of FIG. 18, a planarization is performed into the conductive layer 1302 to localize the conductive layer 1302 to the via openings 1202. Further, the planarization forms a plurality of coupling vias 122v from portions of the conductive layer 1302 localized to the via openings 1202. The coupling vias 122v are individual to and respectively fill the via openings 1202. The planarization may, for example, be performed by a CMP or by some other suitable planarization process.

Figure 19:
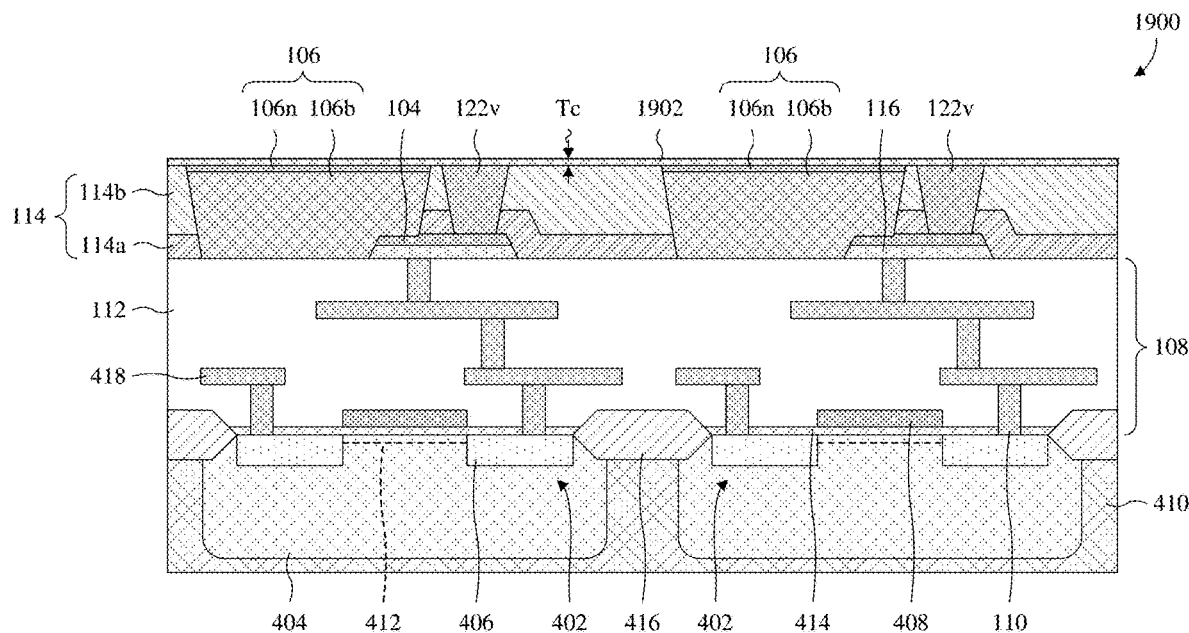

As illustrated by the cross-sectional view 1900 of FIG. 19, an additional conductive layer 1902 is deposited covering the reflectors 106 and the coupling vias 122v. The additional conductive layer 1902 is as the conductive layer 1302 is described with regard to FIG. 13. However, in some embodiments, the additional conductive layer 1902 is also transparent to radiation emitted by subsequently formed light emission devices. For example, the additional conductive layer 1902 may, for example, be or comprise ITO, gold (e.g., Au), silver (e.g., Ag), or some other suitable conductive material, and/or the conductive layer 1302 may, for example, be or comprise titanium nitride (e.g., TiN), tantalum nitride (e.g., TaN), or some other suitable conductive material. As will be appreciated, the transparency of the additional conductive layer 1902 allows the radiation to be reflected by the reflectors 106.

Figure 20:
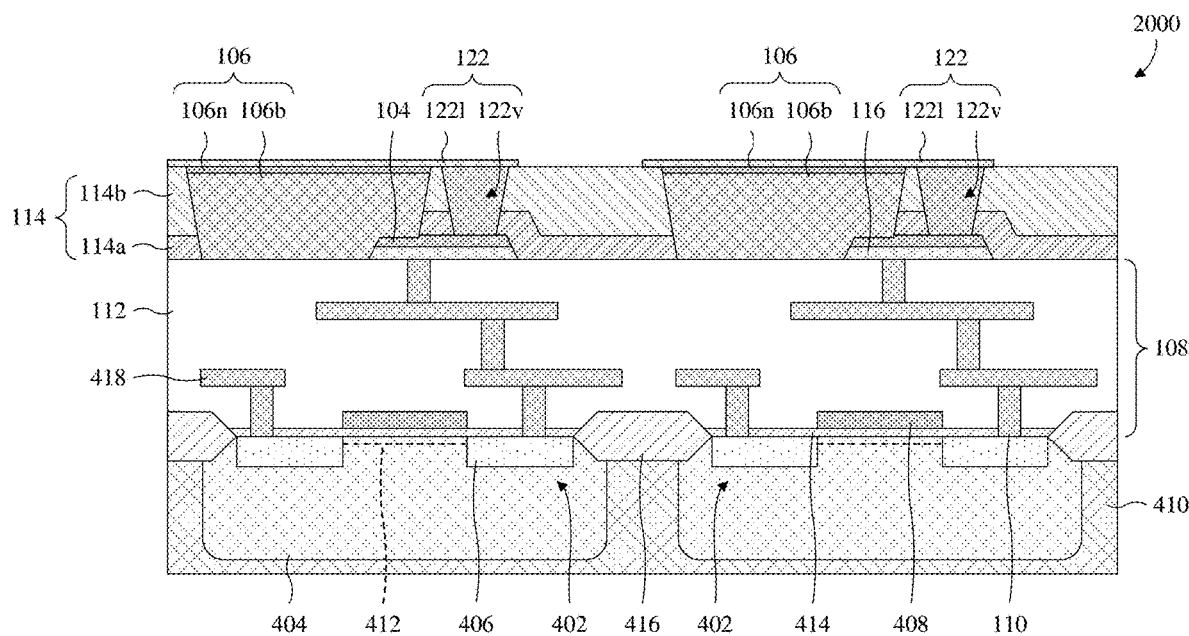
Figure 21:
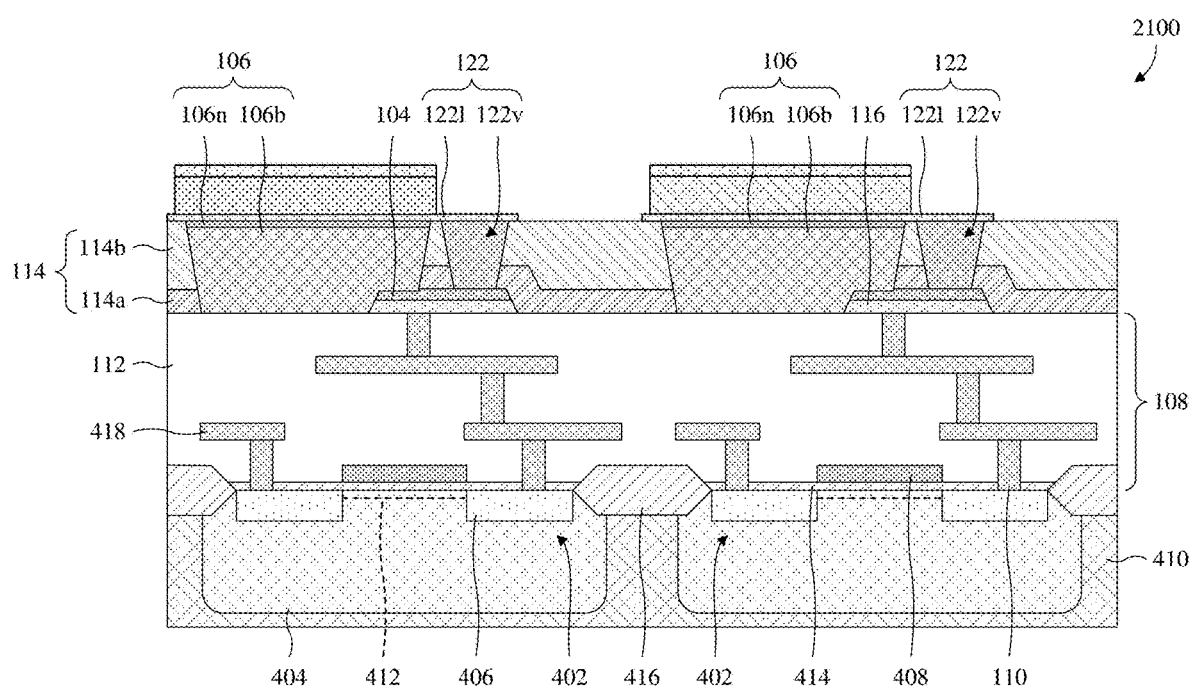

As illustrated by the cross-sectional view 2000 of FIG. 20, the additional conductive layer (see, e.g., FIG. 19) is patterned to form a plurality of coupling layers 1221. The coupling layers 1221 respectively cover the reflectors 106 and the coupling vias 122v. Further, each coupling layer 1221 extends along a top surface of a corresponding reflector 106, from a first sidewall of the corresponding reflector 106 to a second sidewall of the corresponding reflector 106 opposite the first sidewall. The patterning may, for example, be performed a photolithography/etching process or by some other suitable selective etching and/or patterning process.

The coupling layers 1221 and the coupling vias 122v define the coupling structures 122. Each of the coupling structures 122 comprises a corresponding one of the coupling layers 1221 and a corresponding one of the coupling vias 122v. As described above, the coupling structures 122 provide electrical coupling to subsequently formed light emission devices and extend respectively from the bottom electrodes 104, respectively through the via openings 1202 (see, e.g., FIG. 12), respectively to top surfaces of the reflectors 106.

As illustrated by the cross-sectional view 1900 of FIG. 19, the acts described with regard to FIG. 15 are performed as illustrated and described above.

While FIGS. 17-21 are described with reference to various embodiments of a method, it will be appreciated that the structures shown in FIGS. 17-21 are not limited to the method but rather may stand alone separate of the method. While FIGS. 17-21 are described as a series of acts, it will be appreciated that the order of the acts may be altered in other embodiments. While FIGS. 17-21 illustrate and describe as a specific set of acts, some acts that are illustrated and/or described may be omitted in other embodiments. Further, acts that are not illustrated and/or described may be included in other embodiments.

In some embodiments, the present disclosure provides an IC chip including a display pixel, wherein the display pixel includes: a bottom electrode; a reflector bordering the bottom electrode; a light emission device overlying the reflector; a top electrode overlying the light emission device; and a coupling structure extending from the bottom electrode, alongside the reflector, to an interface between the light emission device and the reflector to electrically couple the bottom electrode to the light emission device. In some embodiments, native oxide of the coupling structure has a lesser resistance than native oxide of the reflector. In some embodiments, the reflector partially covers the bottom electrode. In some embodiments, the reflector has a first sidewall and a second sidewall respectively on opposite sides of the reflector, wherein the bottom electrode extends along a bottom surface of the reflector from the first sidewall to the second sidewall. In some embodiments, the reflector has a first sidewall and a second sidewall respectively on opposite sides of the reflector, wherein the coupling structure extends along a top surface of the reflector from the first sidewall to the second sidewall. In some embodiments, the coupling structure includes: a coupling via extending alongside the reflector from the bottom electrode to a top of the reflector; and a coupling layer overlying the reflector and underlying the light emission device, wherein the coupling layer extends laterally from the coupling via to the interface. In some embodiments, the IC chip further includes: a semiconductor substrate; a semiconductor device overlying and inset into the semiconductor substrate; and an alternating stack of wires and vias overlying the semiconductor device; wherein the display pixel overlies the alternating stack, and wherein the alternating stack defines a conductive path from the semiconductor device to the bottom electrode.

In some embodiments, the present disclosure provides another IC chip including: a semiconductor device; a bottom electrode overlying the semiconductor device; an interconnect structure between, and electrically coupled to, the bottom electrode and the semiconductor device; a reflector over the interconnect structure and bordering the bottom electrode; a light emission device overlying the reflector; a coupling via overlying and electrically coupled to the bottom electrode, wherein the coupling via extends alongside the reflector from top to bottom; and a coupling layer extending laterally from a bottom surface of the light emission device to the coupling via. In some embodiments, the coupling via, the coupling layer, and the reflector are conductive, wherein the coupling via and the coupling layer depend on more energy to oxidize than the reflector. In some embodiments, the reflector includes a metal layer and a native oxide layer atop the metal layer, wherein the coupling layer overlies and directly contacts a top surface of the native oxide layer. In some embodiments, the coupling via is a portion of the coupling layer having a top indent. In some embodiments, the coupling via is continuous from a first side of the coupling via to a second side of the coupling via opposite the first side at an elevation about even with a top surface of the reflector. In some embodiments, the coupling via is distinct from and is a different type of material than the coupling layer. In some embodiments, the coupling layer and the reflector collectively have a rectangular top geometry, wherein the reflector has a triangular top geometry at a corner of the rectangular top geometry. In some embodiments, the coupling via directly contacts a sidewall of the reflector. In some embodiments, the reflector has greater reflectance than the coupling layer and/or the coupling via.

In some embodiments, the present disclosure provides a method for forming an IC chip including: forming a bottom electrode overlying and electrically coupled a semiconductor device by an interconnect structure; depositing a pixel dielectric layer covering the bottom electrode; forming a reflector inset into the pixel dielectric layer, wherein the reflector includes a first metal and is adjacent to the bottom electrode; performing an etch selectively into the pixel dielectric layer to form a via opening overlying and exposing the bottom electrode; forming a coupling structure overlying the reflector and extending from the reflector to the bottom electrode through the via opening, wherein the coupling structure includes a second metal; and forming a light emission device overlying the coupling structure and the reflector. In some embodiments, native oxide of the reflector is dielectric, whereas native oxide of the coupling structure is conductive. In some embodiments, the forming of the coupling structure includes: depositing a conductive layer covering the reflector and further lining the via opening; and patterning the conductive layer. In some embodiments, the forming of the coupling structure includes: depositing a first conductive layer filling the via opening; planarizing a top surface of the first conductive layer to form a via in the via opening; depositing a second conductive layer covering the reflector and the via; and patterning the second conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) chip comprising a display pixel, wherein the display pixel comprises:
   a bottom electrode;
   a reflector bordering the bottom electrode;
   a light emission device overlying the reflector;
   a top electrode overlying the light emission device; and
   a coupling structure extending from the bottom electrode, alongside the reflector, to an interface between the light emission device and the reflector to electrically couple the bottom electrode to the light emission device, wherein the coupling structure is localized to a single side of the reflector and recessed into a bottom of the light emission device, such that the light emission device wraps around a top corner of the coupling structure from a sidewall of the coupling structure to a top surface of the coupling structure.

2. The IC chip according to claim 1, wherein native oxide of the coupling structure has a lesser resistance than native oxide of the reflector.

3. The IC chip according to claim 1, wherein the reflector has a first sidewall and a second sidewall respectively on opposite sides of the reflector, and wherein the bottom electrode extends along a bottom surface of the reflector from the first sidewall to the second sidewall.

4. The IC chip according to claim 1, wherein the reflector has a first sidewall and a second sidewall respectively on opposite sides of the reflector, and wherein the coupling structure extends along a top surface of the reflector from the first sidewall to the second sidewall.

5. The IC chip according to claim 1, wherein the coupling structure comprises:
   a coupling via extending alongside the reflector from the bottom electrode to a top of the reflector; and
   a coupling layer overlying the reflector and underlying the light emission device, wherein the coupling layer extends laterally from the coupling via to the interface.

6. The IC chip according to claim 1, further comprising:
   a semiconductor substrate;
   a semiconductor device overlying and inset into the semiconductor substrate; and
   an alternating stack of wires and vias overlying the semiconductor device;
   wherein the display pixel overlies the alternating stack, and wherein the alternating stack defines a conductive path from the semiconductor device to the bottom electrode.

7. The IC chip according to claim 1, wherein the coupling structure comprises a via extending from the bottom electrode to a top of the reflector, and wherein the via is spaced from the reflector.

8. An integrated circuit (IC) chip comprising:
   a semiconductor device;
   a bottom electrode overlying the semiconductor device;
   an interconnect structure between, and electrically coupled to, the bottom electrode and the semiconductor device;
   a reflector over the interconnect structure and bordering the bottom electrode;
   a light emission device overlying the reflector;
   a coupling via overlying and electrically coupled to the bottom electrode, wherein the coupling via extends alongside the reflector from top to bottom; and
   a coupling layer extending laterally from a bottom surface of the light emission device to the coupling via; and
   a dielectric layer overlying the bottom electrode;
   wherein the coupling via has a first sidewall facing the reflector and a second sidewall facing away from the reflector on an opposite side of the coupling via as the first sidewall, and wherein the dielectric layer directly contacts the second sidewall from a top of the second sidewall to a bottom of the second sidewall.

9. The IC chip according to claim 8, wherein the coupling via, the coupling layer, and the reflector are conductive, and wherein the coupling via and the coupling layer depend on more energy to oxidize than the reflector.

10. The IC chip according to claim 8, wherein the reflector comprises a metal layer and a native oxide layer atop the metal layer, and wherein the coupling layer overlies and directly contacts a top surface of the native oxide layer.

11. The IC chip according to claim 8, wherein the coupling via is a portion of the coupling layer having a top indent.

12. The IC chip according to claim 8, wherein the coupling via is continuous from a first side of the coupling via to a second side of the coupling via opposite the first side at an elevation about even with a top surface of the reflector.

13. The IC chip according to claim 8, wherein the coupling via is distinct from and is a different type of material than the coupling layer.

14. The IC chip according to claim 8, wherein the coupling layer and the reflector collectively have a rectangular top geometry, and wherein the coupling layer has a triangular top geometry at a corner of the rectangular top geometry.

15. The IC chip according to claim 8, wherein the coupling via directly contacts a sidewall of the reflector.

16. The IC chip according to claim 8, wherein the dielectric layer further directly contacts the first sidewall from a top of the first sidewall to a bottom of the first sidewall at a location directly between the coupling via and the reflector.

17. A method for forming an integrated circuit (IC) chip comprising:
   forming a bottom electrode overlying and electrically coupled to a semiconductor device by an interconnect structure;
   depositing a pixel dielectric layer covering the bottom electrode;
   forming a reflector inset into the pixel dielectric layer, wherein the reflector comprises a first metal and is adjacent to the bottom electrode;
   performing an etch selectively into the pixel dielectric layer to form a via opening overlying and exposing the bottom electrode;
   forming a coupling structure overlying the reflector and extending from the reflector to the bottom electrode through the via opening, wherein the coupling structure comprises a second metal; and
   forming a light emission device overlying the coupling structure and the reflector.

18. The method according to claim 17, wherein native oxide of the reflector is dielectric, whereas native oxide of the coupling structure is conductive.

19. The method according to claim 17, wherein the forming of the coupling structure comprises:
   depositing a conductive layer covering the reflector and further lining the via opening; and
   patterning the conductive layer.

20. The method according to claim 17, wherein the forming of the coupling structure comprises:
   depositing a first conductive layer filling the via opening;
   planarizing a top surface of the first conductive layer to form a via in the via opening;
   depositing a second conductive layer covering the reflector and the via; and
   patterning the second conductive layer.

* * * * *